United States Patent
Graudejus et al.

(10) Patent No.: US 12,533,673 B2
(45) Date of Patent: Jan. 27, 2026

(54) SOFT AND STRETCHABLE MICROELECTRODE ARRAYS (sMEAs) WITH 3D POCKET AND MICROFLUIDIC CHANNEL

(71) Applicant: BMSEED LLC, Mesa, AZ (US)

(72) Inventors: Oliver Graudejus, Tempe, AZ (US); Francisco Javier Lopez Arellano, Laveen, AZ (US); Cami Caitlyn Rowan, Tempe, AZ (US); Ruben Dario Ponce Wong, Chandler, AZ (US)

(73) Assignee: BMSEED LLC, Mesa, AZ (US)

( * ) Notice: Subject to any disclaimer, the term of this patent is extended or adjusted under 35 U.S.C. 154(b) by 777 days.

(21) Appl. No.: 17/941,072

(22) Filed: Sep. 9, 2022

(65) Prior Publication Data
US 2024/0082843 A1   Mar. 14, 2024

(51) Int. Cl.
*B01L 3/00*   (2006.01)
*H05K 1/14*   (2006.01)

(52) U.S. Cl.
CPC .............. *B01L 3/505* (2013.01); *H05K 1/14* (2013.01); *B01L 2200/12* (2013.01);
(Continued)

(58) Field of Classification Search
CPC ......... G01N 33/4836; B01L 2300/0645; B01L 2300/0654; B01L 2300/123; C12M 23/16; H05K 1/14
See application file for complete search history.

(56) References Cited

U.S. PATENT DOCUMENTS 7,194,170 B2   3/2007 Biegelsen
7,211,442 B2   5/2007 Gilbert et al.
(Continued)

FOREIGN PATENT DOCUMENTS

WO   WO 2012/139124 A1   10/2012
WO   WO 2013/192083 A2   12/2013
WO   WO 2021/097447 A1   5/2021

OTHER PUBLICATIONS

G.S. Guvanasen, A stretchable microneedle electrode array for stimulating and measuring intramuscular electromyographic activity, IEEE Transactions on Neural Systems and Rehabilitation Engineering, 2017, 25 (9), pp. 1440-1452 (Year: 2017).*
(Continued)

*Primary Examiner* — C. Sun
(74) *Attorney, Agent, or Firm* — Birch, Stewart, Kolasch & Birch, LLP

(57) ABSTRACT

A soft and stretchable microelectrode array (sMEA) including a first circuit board having a first though hole; a second circuit board having a second through hole; a microelectrode array including a plurality of microelectrodes embedded in an elastomeric substrate, wherein the microelectrode array is disposed between the first and second printed circuit boards, and includes an exposed portion corresponding the first and second through holes; a plurality of contact pads formed on a top or bottom surface of the first printed circuit board and electrically connected to the plurality of microelectrodes; and a culture well mounted on the first printed circuit board and encompassing the first through hole. Further, the exposed portion of the microelectrode array includes a 3D pocket lined with stretched microelectrodes for electrically stimulating and recording signals from an organoid placed in the 3D pocket.

20 Claims, 32 Drawing Sheets
(32 of 32 Drawing Sheet(s) Filed in Color)

(52) U.S. Cl.
CPC .............. *B01L 2300/0645* (2013.01); *B01L 2300/0654* (2013.01); *B01L 2300/123* (2013.01)

(56) References Cited

U.S. PATENT DOCUMENTS

| | | | |
|---|---|---|---|
| 7,337,012 | B2 | 2/2008 | Maghribi et al. |
| 7,375,404 | B2 | 5/2008 | Park et al. |
| 8,158,410 | B2 | 4/2012 | Tang et al. |
| 8,444,899 | B2 | 5/2013 | DeSimone et al. |
| 9,168,521 | B2 | 10/2015 | Delamarche et al. |
| 9,248,273 | B2 | 2/2016 | Guvanasen et al. |
| 9,279,797 | B2 | 3/2016 | Clements et al. |
| 9,330,820 | B2 | 5/2016 | Allen et al. |
| 9,592,501 | B2 | 3/2017 | Jarvius et al. |
| 9,937,495 | B2 | 4/2018 | Srinivas et al. |
| 10,232,371 | B2 | 3/2019 | Collins |
| 10,497,633 | B2 | 12/2019 | Rogers et al. |
| 10,712,339 | B2 | 7/2020 | Nikkhah et al. |
| 10,840,536 | B2 | 11/2020 | Rogers et al. |
| 2005/0273995 | A1 | 12/2005 | Kanagasabapathi et al. |
| 2009/0136982 | A1 | 5/2009 | Tang et al. |
| 2010/0104480 | A1 | 4/2010 | Viovy et al. |
| 2011/0125001 | A1 | 5/2011 | Fang et al. |
| 2012/0006760 | A1 | 1/2012 | Toner et al. |
| 2013/0303873 | A1* | 11/2013 | Voros .............. H05K 1/0283 604/20 |
| 2014/0093905 | A1 | 4/2014 | Ingber et al. |
| 2016/0097027 | A1 | 4/2016 | Nikkhah et al. |
| 2016/0320374 | A1 | 11/2016 | Lowe et al. |
| 2019/0360995 | A1 | 11/2019 | Rajaraman et al. |
| 2021/0024351 | A1* | 1/2021 | Rajaraman ......... G01N 33/5082 |
| 2021/0394434 | A1 | 12/2021 | Rajaraman et al. |
| 2021/0395670 | A1 | 12/2021 | Rajaraman et al. |

OTHER PUBLICATIONS

Huang et al., "Shell microelectrode arrays (MEAs) for brain organoids," Science Advances, 8 (33), eabq5031, 2022, 11 pages.

Park et al., "Three-dimensional, multifunctional neural interfaces for cortical spheroids and engineered assembloids," Science Advances, 7 (12), eabf9153, 2021, 12 pages.

* cited by examiner

80

(a)          (b)          (c)

(a)          (b)

(a)          (b)

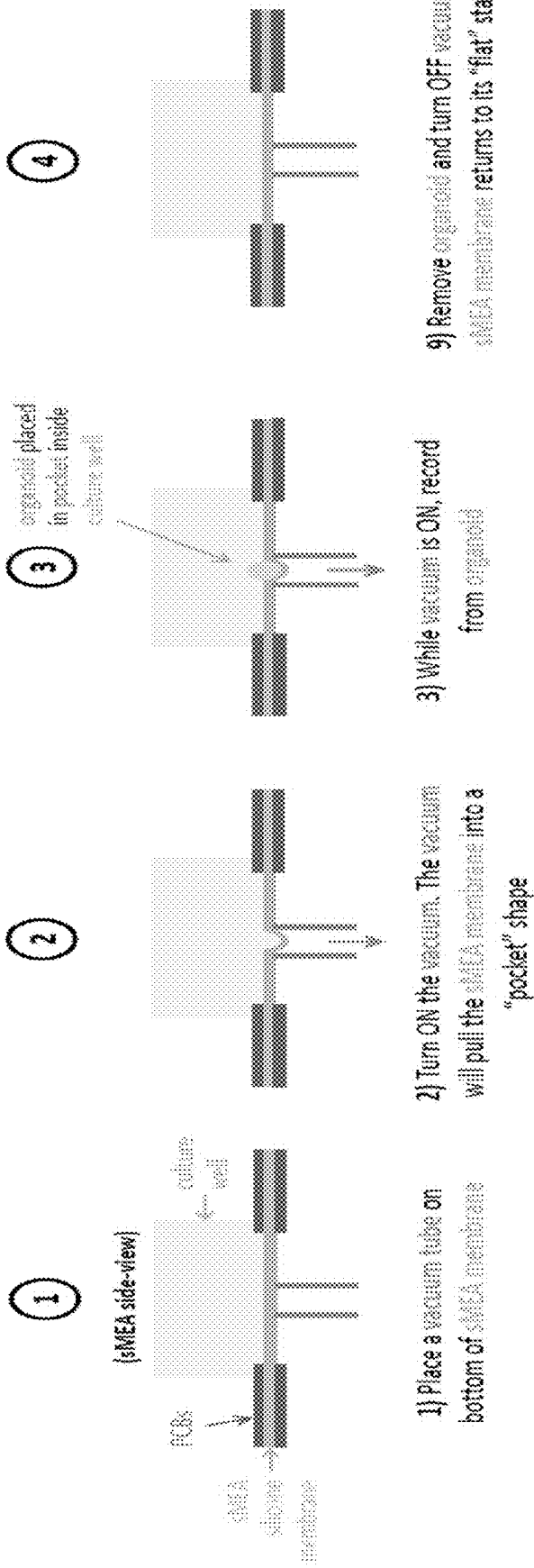

SOFT AND STRETCHABLE MICROELECTRODE ARRAYS (sMEAs) WITH 3D POCKET AND MICROFLUIDIC CHANNEL

BACKGROUND OF THE INVENTION

Field of the Invention

The present invention relates to a stretchable microelectrode array (sMEA) used in in vitro research and in particular to a 3D sMEA with at least one 3D pocket lined with microelectrodes for recording electrophysiological signals from differently shaped organoids. The present invention is also related to a 3D sMEA with cells being arranged in a 3D matrix composed of Matrigel or hydrogel.

Discussion of the Related Art

The advantages of in vitro research include tight control of the chemical and physical environment, and it is faster, cheaper, and fewer animals are needed compared to research in animals in vivo. However, a weakness of in vitro experiments is the failure to replicate the conditions of cells in an organism, which causes cells in vitro to behave differently than the same cell type in vivo. For example, isolated and cultivated primary cells usually differ strongly from the corresponding cell type in an organism, limiting the value of in vitro data to predict in vivo behavior.

One example of a related prior art in vitro method uses a rigid substrate plate having a culture well that is applied with optical or electrical stimulation to determine, for example, the efficacy of a potential drug treatment. For example, a recent review has identified over 100 compounds with 40 different mechanisms of action that had been considered as potential treatments for Alzheimer's disease. Twenty of these compounds showed evidence of benefits in pre-clinical trials, but all candidates failed in Phase III clinical trials, and none was FDA approved. The current in vitro methods do not properly mimic the actual interaction of the cells in the body.

SUMMARY OF THE INVENTION

Accordingly, one aspect of the present invention is to address the above-noted and other problems.

Another aspect of the present invention is to provide a physiologically relevant in vitro model platform for Alzheimer's disease and Alzheimer's disease related dementias (AD/ADRD) drug screening and for mechanistic studies on traumatic brain injury (TBI) as a risk.

Another aspect of the present invention is to provide an in vitro model platform for traumatic brain injury and repeated concussions pertaining to Alzheimer's Diseases and other neurological and neurodegenerative diseases, spinal cord injury, heart arrhythmia and other dysfunctions, as well as toxicological screening of drug candidates on their effect on the heart cells and neurons during pre-clinical drug development.

Yet another aspect of the present invention is to provide a 3D sMEA having a 3D pocket lined with microelectrodes for recording electrophysiological signals from differently shaped organoids.

Another aspect of the present invention is to provide a 3D sMEA with cells being arranged in a 3D matrix composed of a Matrigel or hydrogel.

Still another aspect of the present invention is to provide a 3D sMEA including at least one microfluidic channel for diffusing a biochemical into chambers of the 3D sMEA.

Another aspect of the present invention is to provide a 3D sMEA having flexible pockets formed, for example, by vacuum suction and including stretchable electrodes having a shape of the flexible pocket.

Another aspect of the present invention is to provide a 3D sMEA that can be stretched, electrically stimulated and perfused with a biochemical for decreasing a gap between pre-clinical drug screening and clinical trials.

Still another aspect of the present invention is to provide an experimental model for better understanding the interactions between genetic and environmental risk factors to develop AD/ADRD.

To achieve these and other advantages and in accordance with the purpose of the present invention, as embodied and broadly described herein, the present invention provides in one aspect a soft and stretchable microelectrode array (sMEA) including a first circuit board having a first though hole; a second circuit board having a second through hole; a microelectrode array including a plurality of microelectrodes embedded in an elastomeric substrate, wherein the microelectrode array is disposed between the first and second printed circuit boards, and includes an exposed portion corresponding the first and second through holes of the first and second printed circuit boards; a plurality of contact pads formed on a top or bottom surface of the first printed circuit board and electrically connected to the plurality of stretchable microelectrodes; and a culture well mounted on the first printed circuit board and encompassing the first through hole of the first circuit board. Further, the exposed portion of the microelectrode array includes a 3D pocket lined with stretched microelectrodes for electrically stimulating and recording signals from an organoid placed in the 3D pocket.

In another aspect, the present invention provides a soft and stretchable microelectrode array (sMEA) including a first circuit board having a first though hole; a second circuit board having a second through hole; a microelectrode array including a plurality of microelectrodes embedded in an elastomeric substrate, wherein the microelectrode array is disposed between the first and second printed circuit boards, and includes an exposed portion corresponding the first and second through holes of the first and second printed circuit boards; a plurality of contact pads formed on a top or bottom surface of the first printed circuit board and electrically connected to the plurality of stretchable microelectrodes; an interior central chamber formed in an interior central portion of the elastomeric substrate and configured to receive a first 3D matrix; and a peripheral chamber formed in an interior peripheral portion of the elastomeric substrate and encompassing a partial portion of the central chamber and configured to receive a second 3D matrix.

In still another aspect, the present invention provides a micro electrode array stimulating and recording equipment, which includes a camera configured to capture images; an interface board configured to mount a soft and stretchable microelectrode array (sMEA) including a first circuit board having a first though hole; a second circuit board having a second through hole; a microelectrode array including a plurality of microelectrodes embedded in an elastomeric substrate, wherein the microelectrode array is disposed between the first and second printed circuit boards, and includes an exposed portion corresponding the first and second through holes; a plurality of contact pads formed on a top surface of the first printed circuit board and electrically connected to the plurality of microelectrodes, and a culture well mounted on the first printed circuit board and encompassing the first through hole; a vacuum tube disposed below the microelectrode array and configured to provide a vacuum suction force to suck a portion of the microelectrode array to create a 3D pocket in the microelectrode array; a vacuum pump configured to provide the vacuum suction force to create a vacuum-formed 3D pocket lined with vacuum-stretched microelectrodes for electrically stimulating and recording signals from the organoid placed in the vacuum-formed 3D pocket; and a processor configured to apply a voltage or a current to the microelectrodes to electrically stimulate the organoid in the vacuum-formed 3D pocket, record electrical responses of the organoid placed in the vacuum-formed 3D pocket in response to the applied voltage or current to the microelectrodes, and control the camera to capture images of an organoid placed in the vacuum-formed 3D pocket.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention will become more fully understood from the detailed description given hereinbelow and the accompanying drawings, which are given by illustration only, and thus are not limitative of the present invention, and wherein:

FIG. 18C is a flow diagram illustrating a method of forming a flexible 3D pocket according to one embodiment of the present invention;

DETAILED DESCRIPTION OF THE EMBODIMENTS

Reference will now be made in detail to the preferred embodiments of the present invention, examples of which are illustrated in the accompanying drawings.

Figure 1:
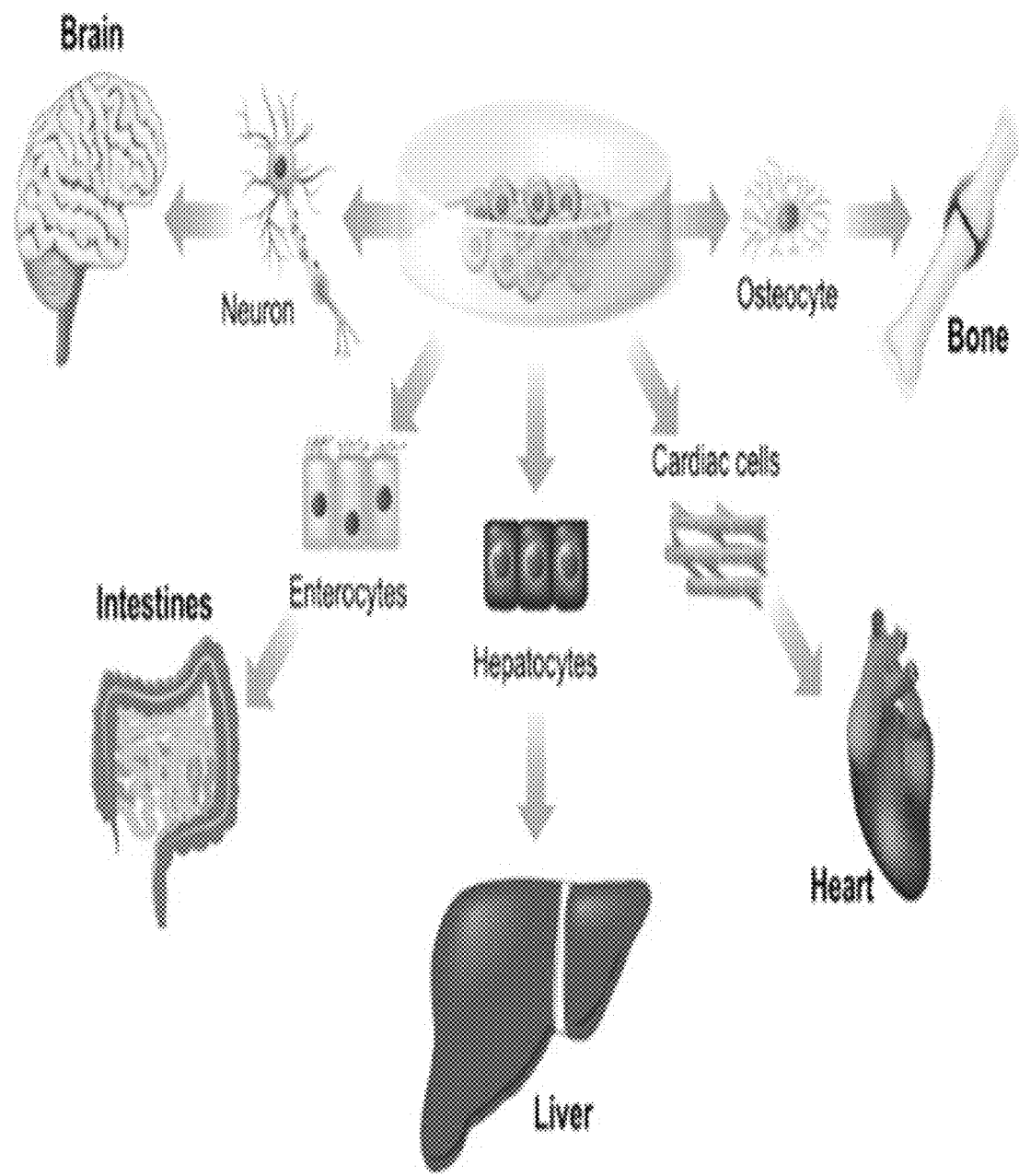
FIG. 1 is an overview of stem cells grown into different body organ cell types.

FIG. 1 is an overview illustrating growing stem cells into different organ cells (e.g., brain cells, intestines cells, liver cells, heart cells and bone cells). That is, in tissue engineering, stem cells are grown or differentiated into a specific tissue having properties that resemble adult tissue. For example, as shown in FIG. 1, the stem cells can be placed in a rigid glass plate or well, and then manipulated or grown into different cell types. However, cells in these in vitro experiments often behave differently than cells of the same type in vivo. A major reason for this divergence is that in vitro experiments do not sufficiently replicate the varying environment of cells in a living organism (e.g., caused by maturity, particularly cardiac cells, and also genotypic and phenotypic differences due to the differences in mechanical and electrical environments).

That is, cells in the human body are subject not to only electrical activity (e.g., neuron and muscular activity), but are also subject to mechanical deformation (stretching, compression, shear, etc.). In more detail, cells in the body are generally exposed to two types of mechanical environments including physiological stretching, where the cells are stretched within their healthy limits, and pathological stretching, where the cells are stretched beyond their healthy limits, causing a trauma.

Physiological stretching of cells can be advantageously used in tissue engineering, drug toxicity testing and in mechano-biology experiments (e.g., sensing mechanical forces in neurons and other cell types). Pathological stretching of cells can be advantageously used to research and find treatments for neurotrauma, concussions, muscle injuries, cell repair and neurodegenerative diseases. In vitro experiments with both electrical and mechanical stimulation can be used to better understand the effect of mechanical forces on the cells (e.g., before, during and after stretching). In particular, the electrodes can stimulate the cells electrically, and the electrodes can readout or record the electrophysiological activity of the cells, which is a proxy for cell health, function, and maturity, before and after stretching.

Figure 2A:
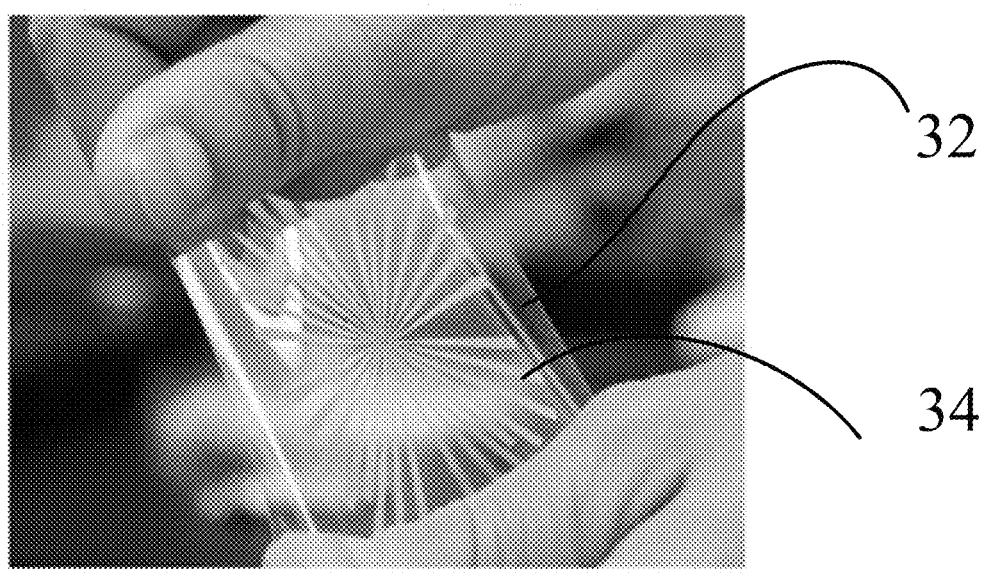
FIG. 2A is an overview of a stretchable elastomeric substrate including stretchable microelectrodes according to an embodiment of the present invention.

Accordingly, the present invention includes embodiments directed to sMEAs that can be mechanically stretched and strained to simulate mechanical forces occurring in the human body in addition to electrical, and optical stimulation. For example, FIG. 2A is an overview illustrating soft and elastically stretchable microelectrodes 34 embedded in an elastomeric silicone substrate 32, for example, used in an sMEA.

Figure 2B:
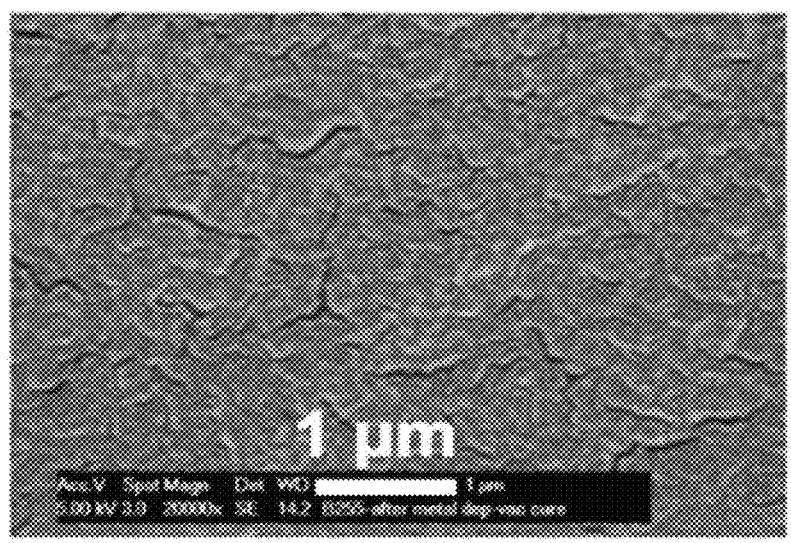
FIG. 2B is an electron microscopy image of a microcracked gold film used in the microelectrodes of the sMEA.

In addition, FIG. 2B is a magnified view of a microcracked gold film used to create the microelectrodes 34. The microcracked gold film disclosed in U.S. Pat. No. 7,491,892 issued on Feb. 17, 2009, is one example of such a microcracked gold film. U.S. Pat. No. 7,491,892 is hereby incorporated by reference in its entirety. According to an embodiment of the present invention, the microcracked gold films offer a combination of desirable properties including low electrical impedance, elastically stretchable, low elastic modulus, low fatigue and are generally inexpensive. Further, microcracked gold films can be stretched by over 70% while remaining electrically conductive. On the contrary, smooth gold films rupture at strains less than 2% and cease to electrically conduct. Controlling the morphology of the gold film includes fine tuning the process parameters that affect the morphology such as the elastic modulus, pre-treatment of the silicone, selecting the film thickness, choosing the desirable deposition temperature, and selecting the adhesion layer.

Figure 3A:
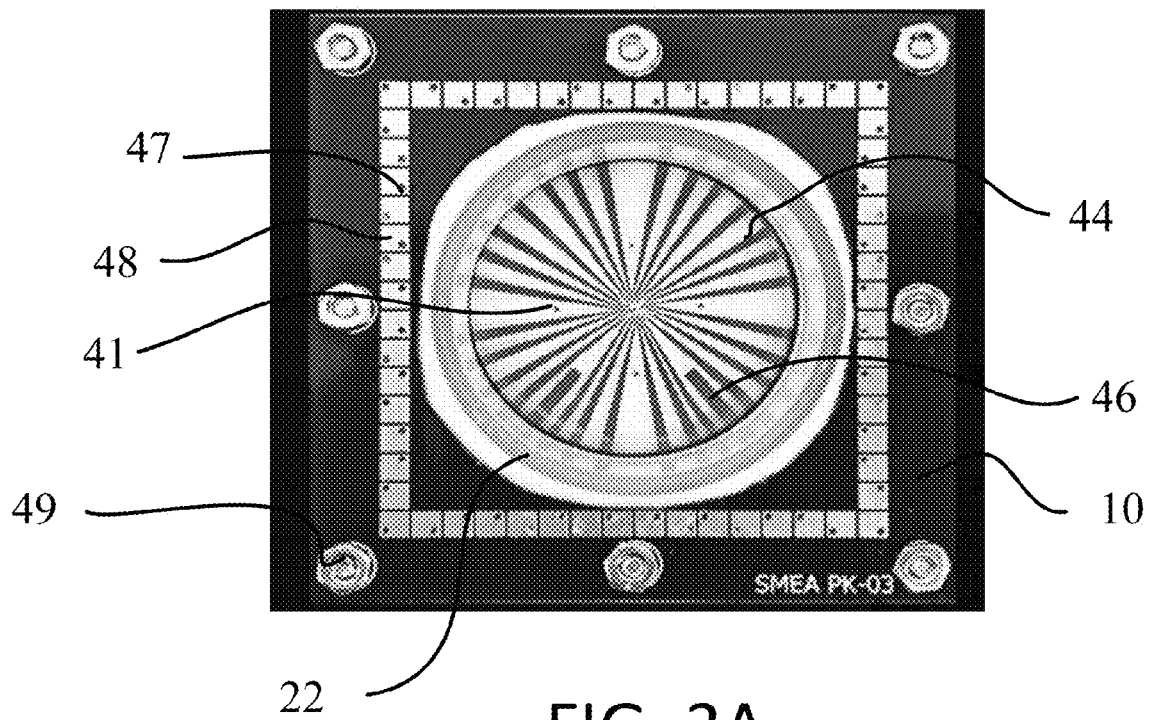
FIGS. 3A-3F include overviews of sMEAs according to different embodiments of the present invention.
Figure 3B:
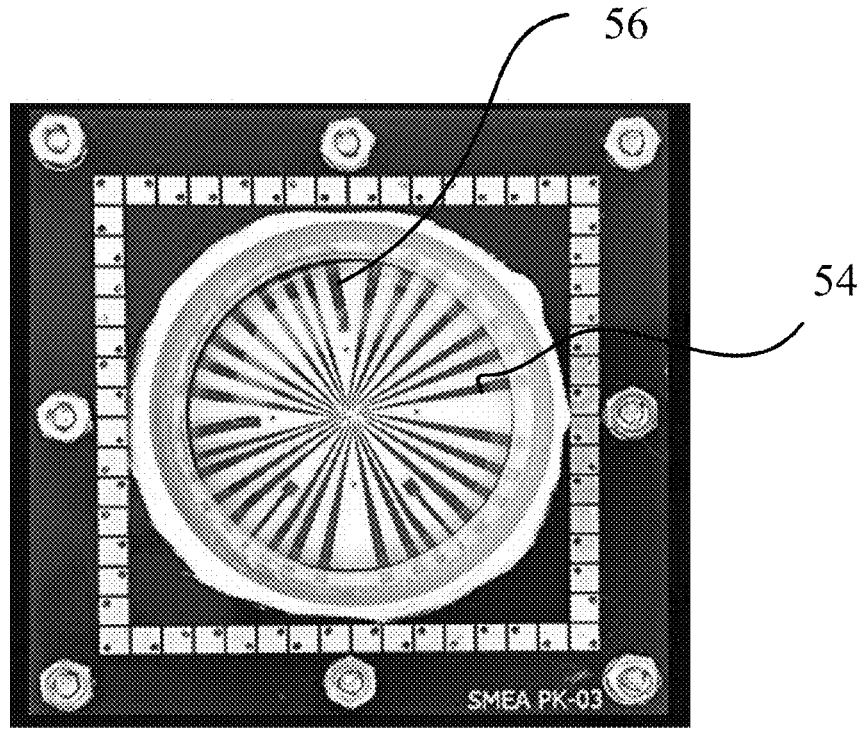
Figure 3C:
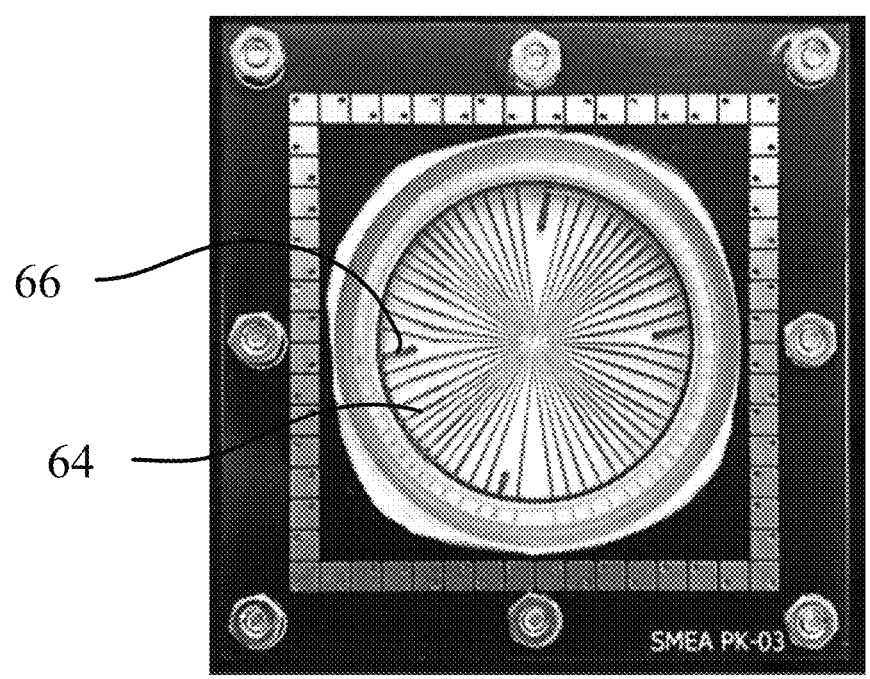
Figure 3D:
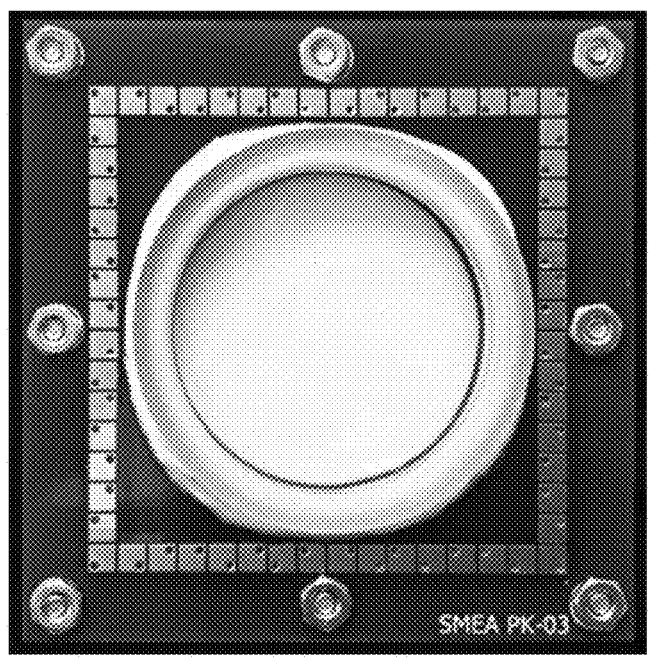

Next, FIGS. 3A-3F are overviews illustrating sMEAs according to different embodiments of the present invention. In particular, FIG. 3A illustrates an sMEA 40 with twenty-eight microelectrodes 44 and two reference electrodes 46, FIG. 3B illustrates an sMEA 50 with twenty-eight microelectrodes 54 and four reference electrodes 56, and FIG. 3C illustrates an sMEA 60 with fifty-six microelectrodes 64 and four reference electrodes 66. FIG. 3D illustrates a Stretch-Well (sW) with no electrodes.

As shown in FIG. 3A, the sMEA 40 includes twenty-eight microelectrodes 44 and two reference electrodes 46 embedded in a soft and stretchable elastomeric substrate (made of polydimethylsiloxane (PDMS), for example). The reference microelectrodes 46 provide a reference potential and are internal reference electrodes embedded in the sMEA. An alternative arrangement is to use an external Pt or Ag/AgCl electrode that is immersed in the cell culture medium. Further, the reference electrodes 46 provide a background signal, and therefore preferably the cells are not placed over or near the reference electrodes 46. In the electrophysiology module of the MEASSuRE, the reference potential is subtracted from the potentials recorded on each microelectrode 44.

FIG. 3A also illustrates the sMEA 40 including contact pads 48 having vias 47 that connect the contact pads 48 on top of the PCB 10 with the contact pads 48 at the bottom of the PCB 10, which in turn connect to the microelectrodes on the PDMS. The contact pads 48 shown in FIG. 3A are used to pass the current or voltage in between the controller of the electrophysiology module and the microelectrodes of the sMEA. Therefore, electrical stimulation can be applied to a particular area of the cell culture contained on the microelectrodes 44 of the sMEA 40 and electrical signals from corresponding cells included in the cell culture can be recorded. In addition, each microelectrode 44 can be individually controlled (e.g., an electrical current can be applied to all the electrodes or any subset of microelectrodes, and also some of the microelectrodes 44 can be used to apply an electrical stimulation to cells in the cell culture and the other microelectrodes 44 can be used to record electrical signals from the cells included in the corresponding cell culture).

According to one embodiment of the present invention, the cells included in the cell culture can be stimulated with either an electrical current or voltage using a first set of microelectrodes 44, and a second set of microelectrodes 44 can be controlled to record electrical signals (e.g., voltages) of the cells. A greater number of microelectrodes 44 can also be used to record voltages from the cells or a larger and dedicated microelectrode 44 or microelectrodes 44 can be used to apply electrical stimulation and the other microelectrodes 44 can be used to record voltages of the cells. In one example, each microelectrode 44 includes its own contact pad 48 such that each microelectrode 44 can be selectively controlled.

In addition, as shown in FIG. 3A, the sMEA 40 also includes a culture well 22 made of a molded plastic or glass, for example, which surrounds a central area of the sMEA 40 (see also FIG. 4F for a side view of the culture well 22). The culture well 22 can be mounted to the PCBs 10 via a sealing mechanism such as an epoxy glue. For example, the Dow Corning No. 832 Silicone Sealant, for Masonry, 10.1-Ounce Cartridge, Off-White can be used as such a sealing mechanism. The cell culture is then contained within the culture well 22. Thus, a cell culture can be placed within the culture well 22 to cover a location on the microelectrodes 44.

Further, the sMEA 40 includes mounting portions 49 (e.g., screws) for securing a compression bond between the stretchable elastomeric membrane and upper and lower PCBs (see FIGS. 10A-10D). In the example shown in FIG. 3A, the mounting portions 49 include a screw and nut made of metal or plastic, for example. In addition, FIG. 3A also illustrates alignment marks 41 that can be used to align the features of the gold electrodes with the features of the encapsulation layer, which is bonded on top of the gold layer during fabrication of the sMEA.

Figure 3E:
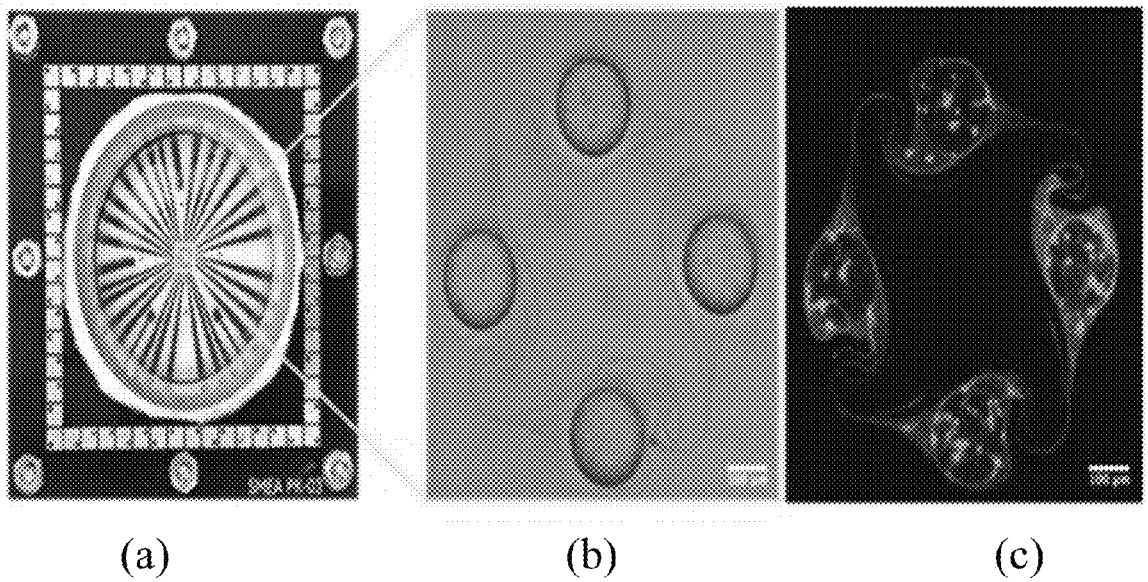

Next, FIG. 3B illustrates an alternative embodiment of an sMEA 50 having twenty-eight microelectrodes 54 and four reference electrodes 56. In addition, FIG. 3C illustrates yet another embodiment of an sMEA 60 including fifty-six microelectrodes 64 and four reference electrodes 66. Also, FIG. 3D illustrates a stretchwell 70 having no internally embedded electrodes. Rather, electrical stimulation can be applied to a cell culture contained in the stretchwell 70 using external electrodes physically placed into the stretchwell 70. The stretchwell 70 can also be used for cell seeding protocol optimization, and only cell stretching if the cells are not electrophysiologically active, for example. In addition, FIG. 3E illustrates an sMEA 80 with microchannel structures. The sMEA 80 promotes structured neuronal networks with axonal guidance to study how neuronal structure correlates to function and allows for recording and stimulating extracellular electrophysiological activity. In more detail, in the sMEAs shown in FIGS. 3A-3C, neuronal cells can grow axons and make connections randomly. However, for sMEAs as shown in FIG. 3E, the axons are guided in microchannels that connect small wells with the cell bodies, as shown in FIG. 3E(b). FIG. 3E(c) illustrates that the axons grow only in the channels, i.e., the channels did not collapse and the bonding is tight. When the sMEA in FIG. 3E is stretched, the strain is mainly applied to the axons in the microchannels. Further, the different electrode patterns and number of electrodes included in the sMEA can also be advantageously customized.

Figure 3F:
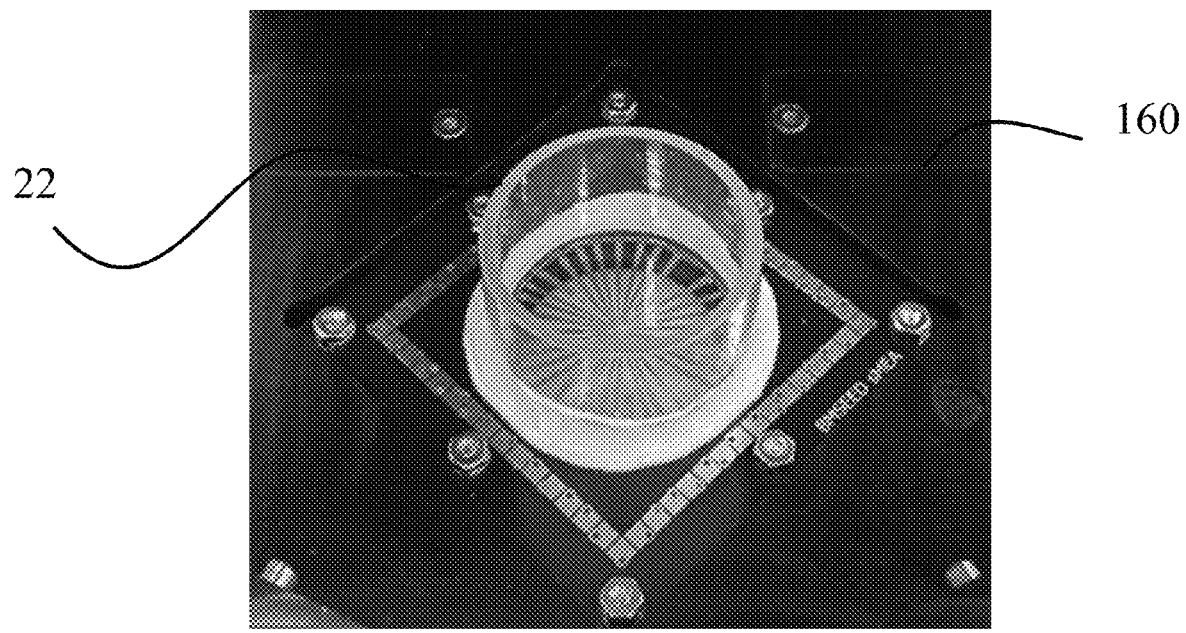

In addition, FIG. 3F illustrates an sMEA mounted to an interface board 160 (see FIGS. 10A-10D). As shown, the sMEA 10 includes the culture well 22 made of plastic or glass, for example, that surrounds a central area of the sMEA 10. The cell culture can then be placed within the well 22 into the electrode pattern of the sMEA. The circuit board 160 can then be mounted onto the MEASSuRE for conducting different experiments.

Figure 4A:
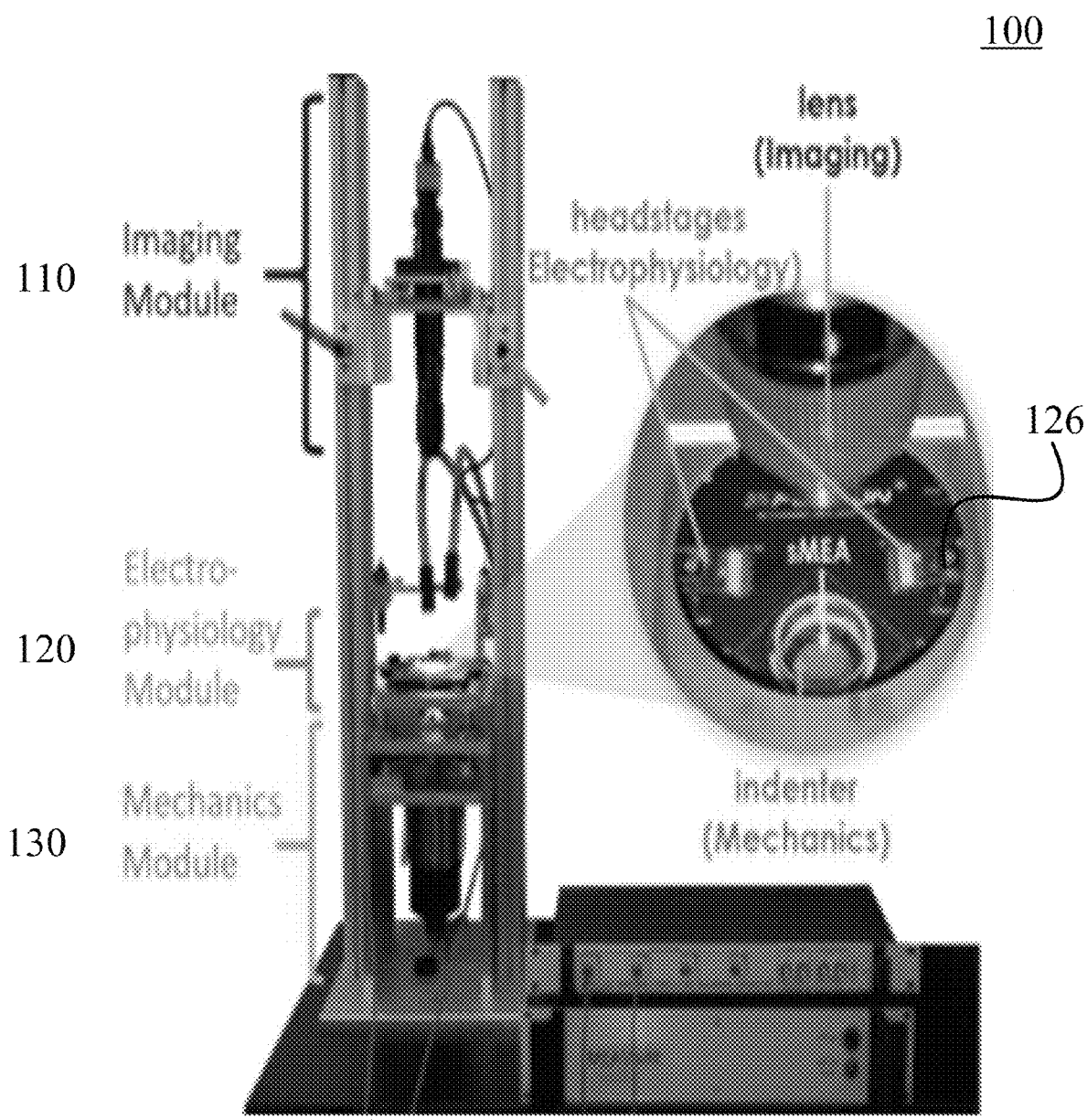
FIG. 4A is an overview of a Micro Electrode Array Stretching Stimulating and Recording Equipment (MEASSuRE) with an sMEA according to an embodiment of the present invention.

Next, FIG. 4A illustrates a MEASSuRE 100 for advantageously applying both mechanical and electrical stimulation to the cells on the sMEA, as well as recording the cell activity according to one embodiment of the present invention. An imaging module for high-resolution imaging of the cells is also provided. That is, FIG. 4A is an overview of a MEASSuRE 100 including an imaging module 110, an electrophysiology module 120 and a mechanics module 130. A perfusion module 500 (see FIG. 19) can also be integrated into the MEASSuRE 100.

The imaging module 110 can produce images, for example, with a frame rate of 50 fps to 3000 fps, or lower or higher. The imaging module 110 includes optical components such as a camera, optical lenses, etc. that are operated to capture images of the cells before, during and after mechanical stretching to measure the tissue strain. The resolution of the images includes, for example, a 2 MP resolution. The imaging module 110 can also be adapted to fluorescence imaging.

Figure 4B:
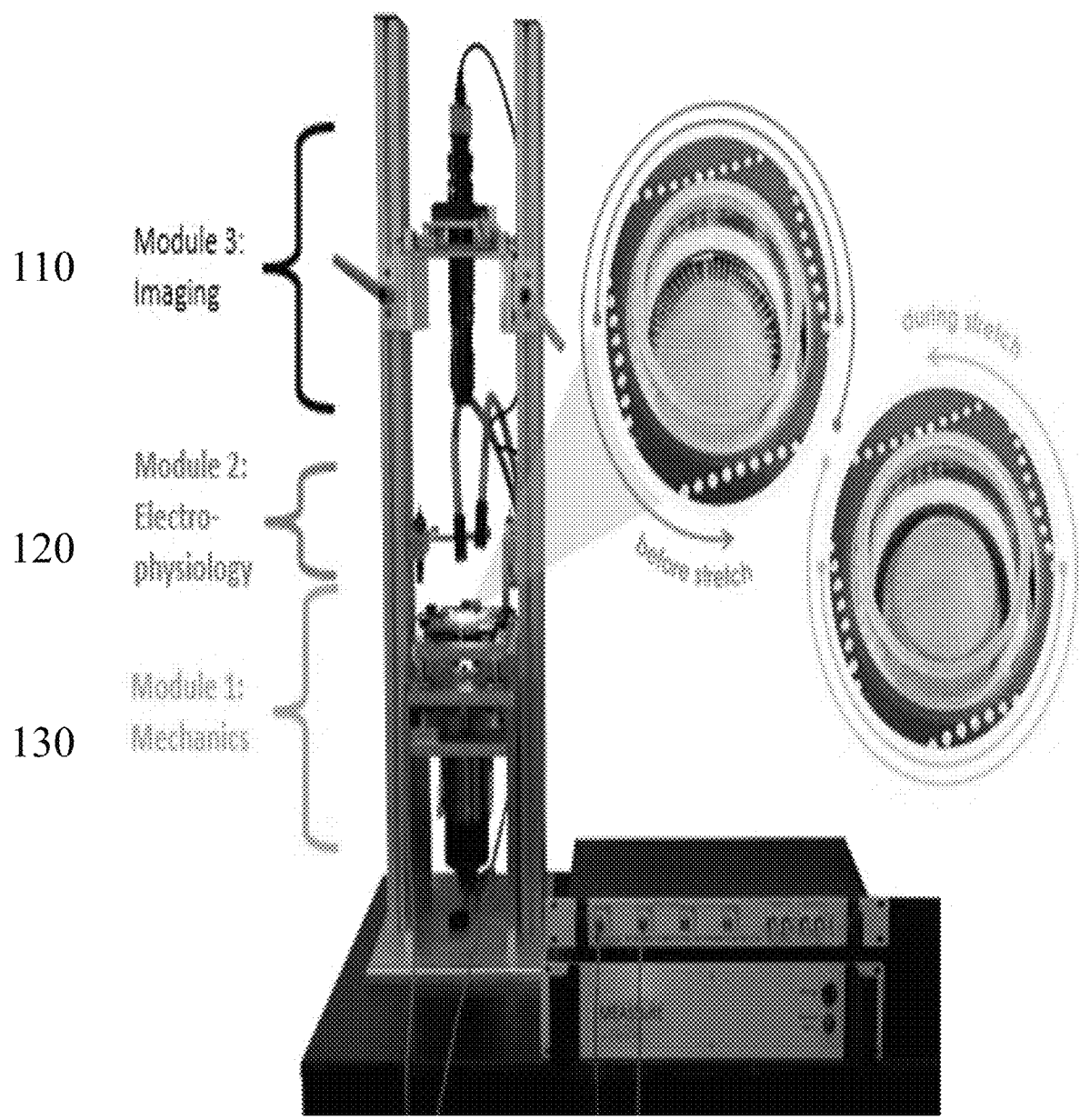
FIG. 4B is an overview of the MEASSuRE with an sMEA before and during stretching according to an embodiment of the present invention.

As shown in the upper right side of FIG. 4A, the imaging module 110 includes an imaging lens that is moved to about 10-100 mm from the sample/cells. The distance between the tip of the lens and the sample/cells, which is referred to as a working distance, depends on the type of adapters and lens used. The imaging module 110 is moveable on tracks or aluminum extrusions 108 (see FIG. 5A) of the MEASSuRE 100, and thus the lens can be placed in close working distance to the sMEA. Therefore, the MEASSuRE can be used to image and record live cells being subjected to mechanical and electrical stimulation (and before and after). FIG. 4B is similar to FIG. 4A but illustrates the sMEA before and during stretching via the mechanics module. As shown in the upper right side of FIG. 4B, the sMEA is stretched via an indenter included in the mechanics module 130.

Figure 5A:
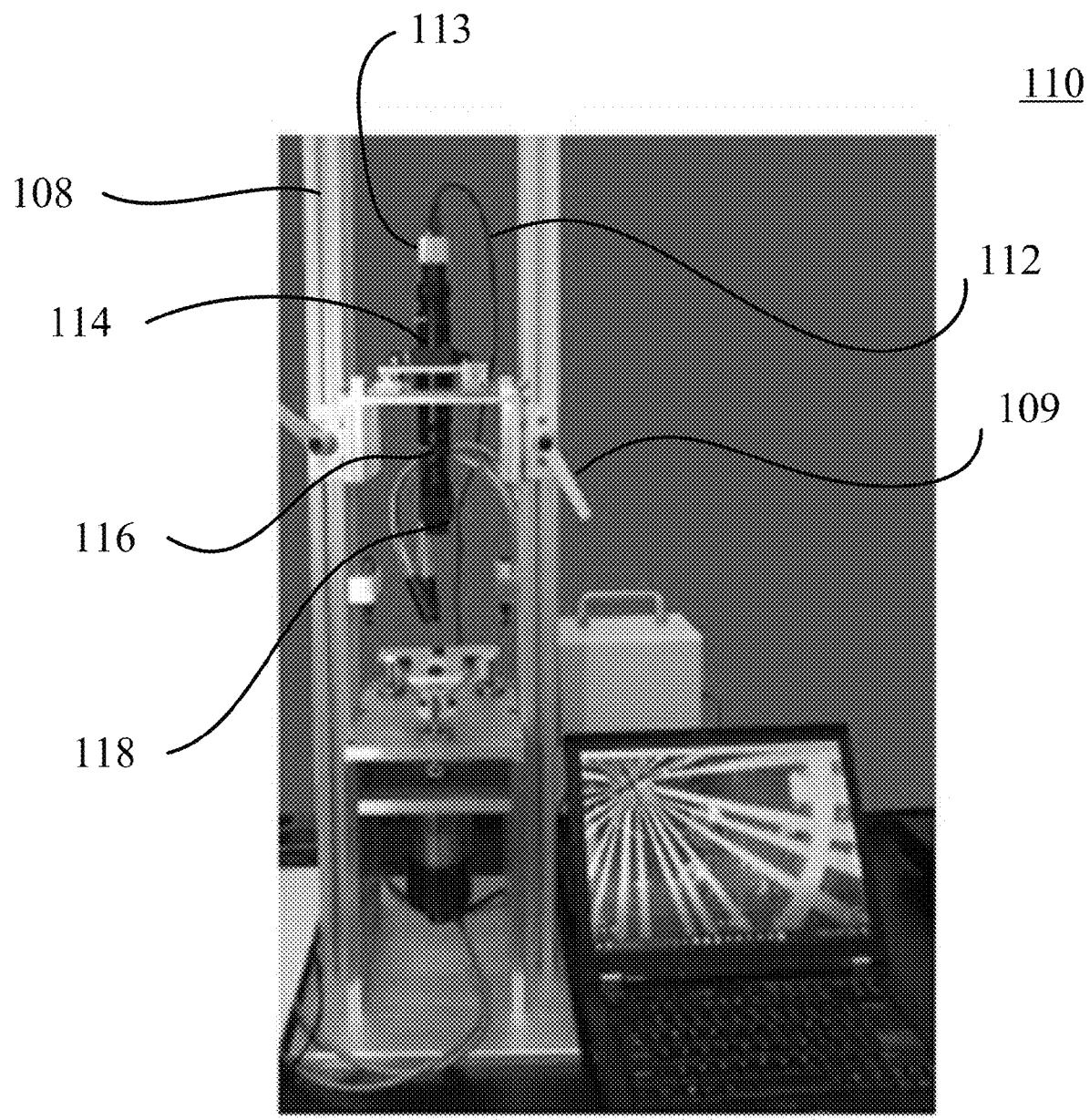
FIG. 5A is an overview of an imaging module and a mechanics module included in the MEASSuRE according to an embodiment of the present invention.

Next, FIG. 5A is an overview illustrating components of the imaging module 110 (the mechanics module 130 is also illustrated in FIG. 5A and will be described further in FIG. 7). Further, FIG. 4 shows the MEASSuRE 100 including a cell mechanics module, an imaging module, and an electrophysiology module, but FIG. 5A shows the MEASSuRE tool configuration with only the cell mechanics and imaging components. The imaging module 110 will now be described in more detail.

As shown, the imaging module 110 is moveably mounted on the tracks 108 via adjustment levers 109. The adjustment levers 109 can be rotated counterclockwise to smoothly slide the imaging module 110 up and down on the tracks 108. When a desired imaging position or working distance is obtained, the location of the imaging module 110 on the tracks 108 can be secured by rotating the adjustment levers 109 in a clockwise direction.

Figure 5B:
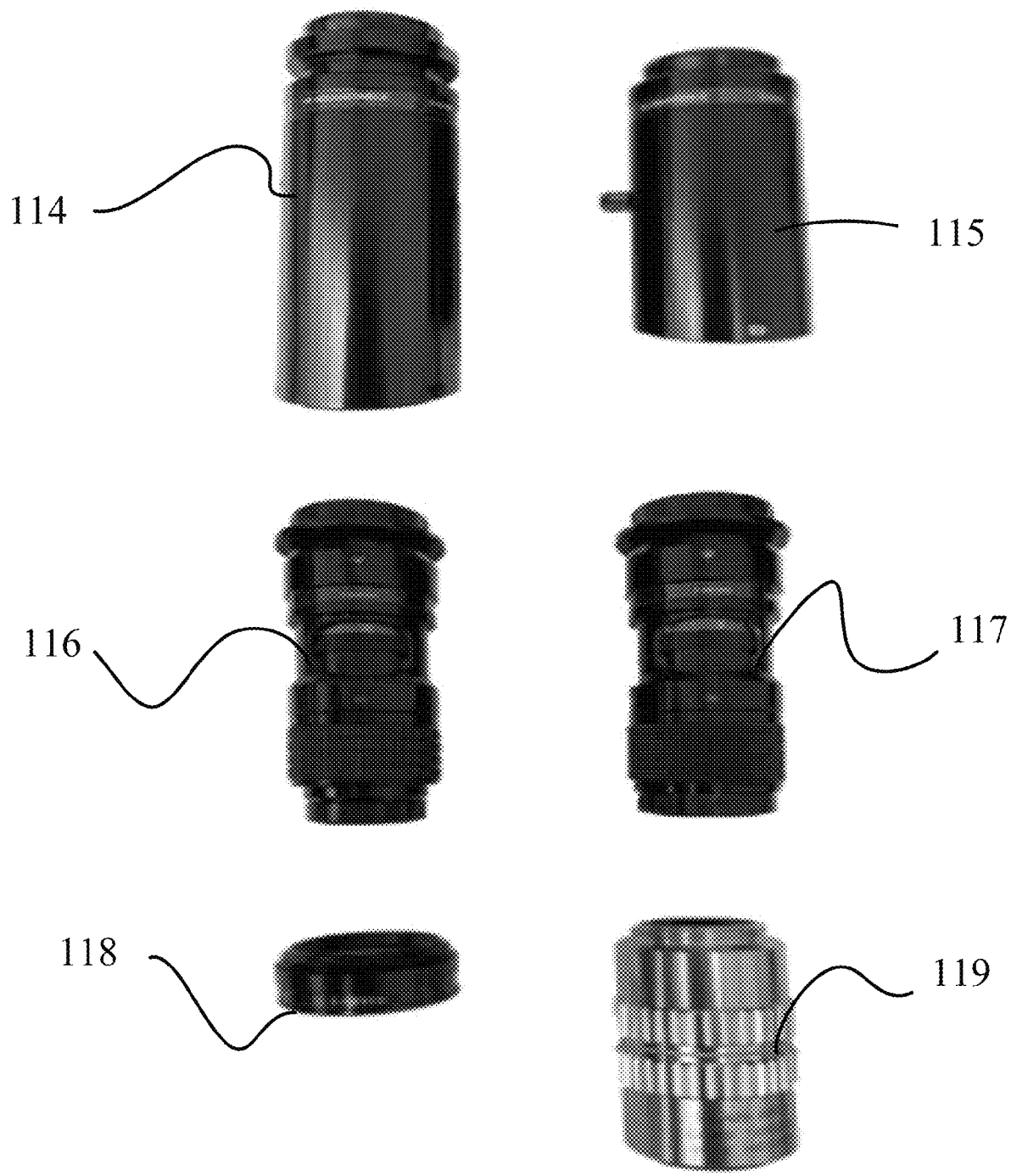
FIG. 5B is an overview of optical components of the imaging module according to an embodiment of the present invention.

In addition, the imaging module 110 includes an adapter 114 located between a zoom lens 116 and the camera 113. The imaging module 110 may also optionally include a lens attachment 118 to adjust the resolution and magnification of the camera. As shown in FIG. 5B, the adapter 114 includes a 1× adjustable standard adapter with no magnification and a standard length. The adapter 114 can also include a 2× adjustable shorter/longer adapter 115 with a 2× magnification. The shorter adapter can compensate for a larger objective. The order of components in the imaging module 110 is the camera 113, the adapter 114, the zoom lens 116, and any optional lens attachments.

As shown in FIG. 5B, the zoom lens 116 includes a Zoom 6000 lens with a 0.7-4.5× magnification and a 12 mm fine focus. The zoom lens can also include an UltraZoom 6000 lens 117 with a 0.7-4.5× magnification and a 12 mm fine focus, and which is coupled with an objective using a coupler piece. The lens attachment 118 also includes a 2× lens attachment having a 2× magnification, which increases the magnification but decreases the field of view. Lens attachments are also available for magnifications of 2.0×, 1.5× and <1×. A 10× motic objective 119 can also be included in the imaging module 110 with a 10× magnification range which increases the magnification but decreases the working distance.

Figure 5C:
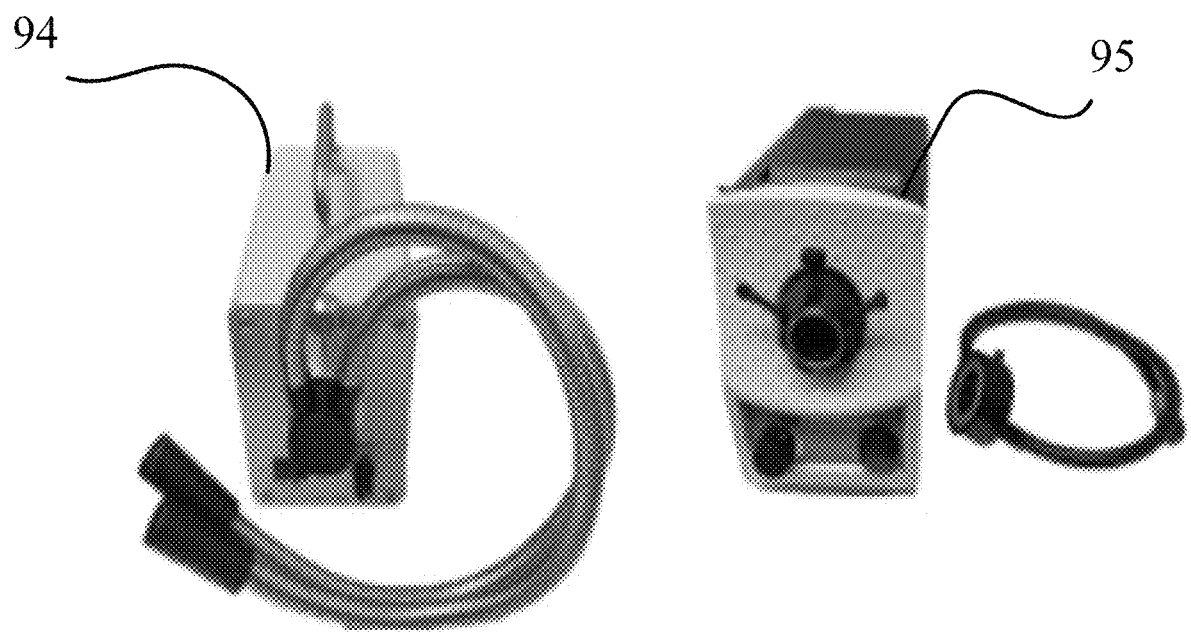
FIG. 5C is an overview of optical components providing optical light of the imaging module according to an embodiment of the present invention.

Further, various methods of supplying additional light can be included with the imaging module 110. For example, as shown in FIG. 5C, an LED fiber optic illuminator 94 with dual gooseneck lights can be coupled to the imaging module 110. The fiber optic illuminator can include a 50 W LED and illuminates the sMEA from the top or bottom, for example. An LED fiber optic illuminator 95 with an 80 W ring light can also be provided for illuminating the sMEA from above.

The imaging module 110 can be used to perform optical imaging of live cells during the stretching motion, electrical stimulation, and optical stimulation. Fluorescent imaging can also be provided. The captured images are then transferred to a computer via the optical and power cable 112 (see FIG. 5A). The transferred images can then be processed to determine the different characteristics of the cells.

In more detail, images before and during stretching can be selected based on the desired stretching time point. One example includes determining the maximum strain that the cells experience. Once the images before and during stretching are selected, spatial registration using an image analysis code (e.g., written in Matlab) or a Digital Image Correlation (DIC) technique allows to calculate the exact strain the tissue experienced.

Figure 6:
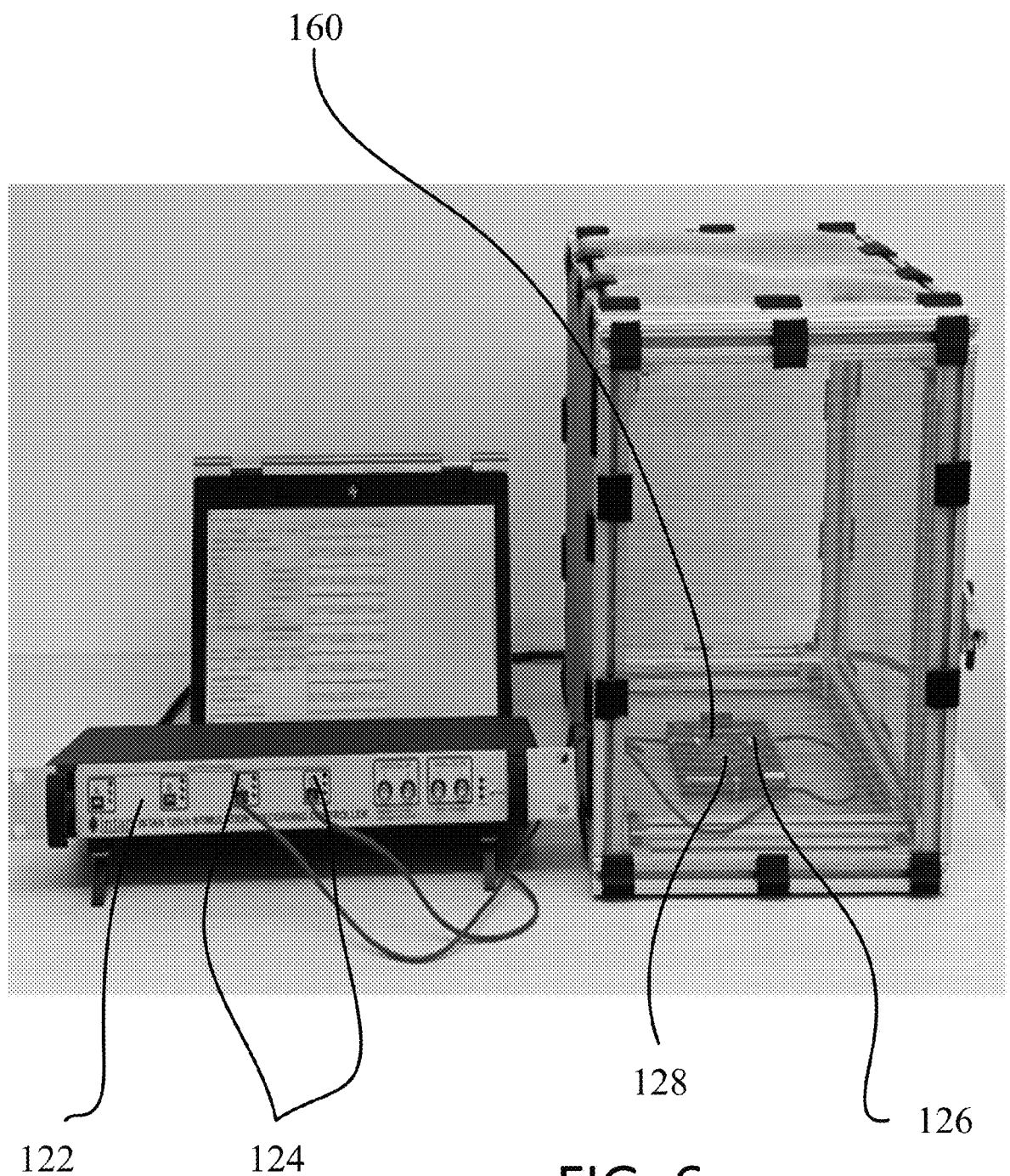
FIG. 6 is an overview of an electrophysiology module included in the MEASSuRE according to an embodiment of the present invention.

Next, FIG. 6 is an overview of the electrophysiology module 120 of the MEASSuRE 100. The electrophysiology module 120 is illustrated as a standalone component in FIG. 6, but as illustrated in FIG. 4, the electrophysiology module 120 can be integrated with the MEASSuRE 100. As shown in FIG. 6, the electrophysiology module 120 includes a stimulation and recording controller 122 such as an Intan 128ch stimulation and recording controller. The controller 122 in FIG. 6 includes input and output ports 124 for connecting the controller 122 to the Omnetic connectors 126 (see also FIG. 4) of the interface board 160 securing the sMEA 128 having the cell culture. A computer and corresponding monitor display can also be interfaced with the MEASSuRE for displaying input values applied to the sMEA and output values indicating the cell characteristics when electrically stimulated. FIG. 6 illustrates the controller 122 including four ports with thirty channels each for a total of 120 channels. In one example, two ports with 30 channels for a total of 60 channels sMEAs are used, but in another example, all 120 channels could be used.

Further, the electrical stimulation can be a current or voltage. For example, currents ranging from nano-amperes to several milli-amperes can be applied. The stimulation can be mono, bi or triphasic. In addition, the recorded electrical signal from the cells are generally in the 10s of microvolts to the millivolt range.

Figure 7:
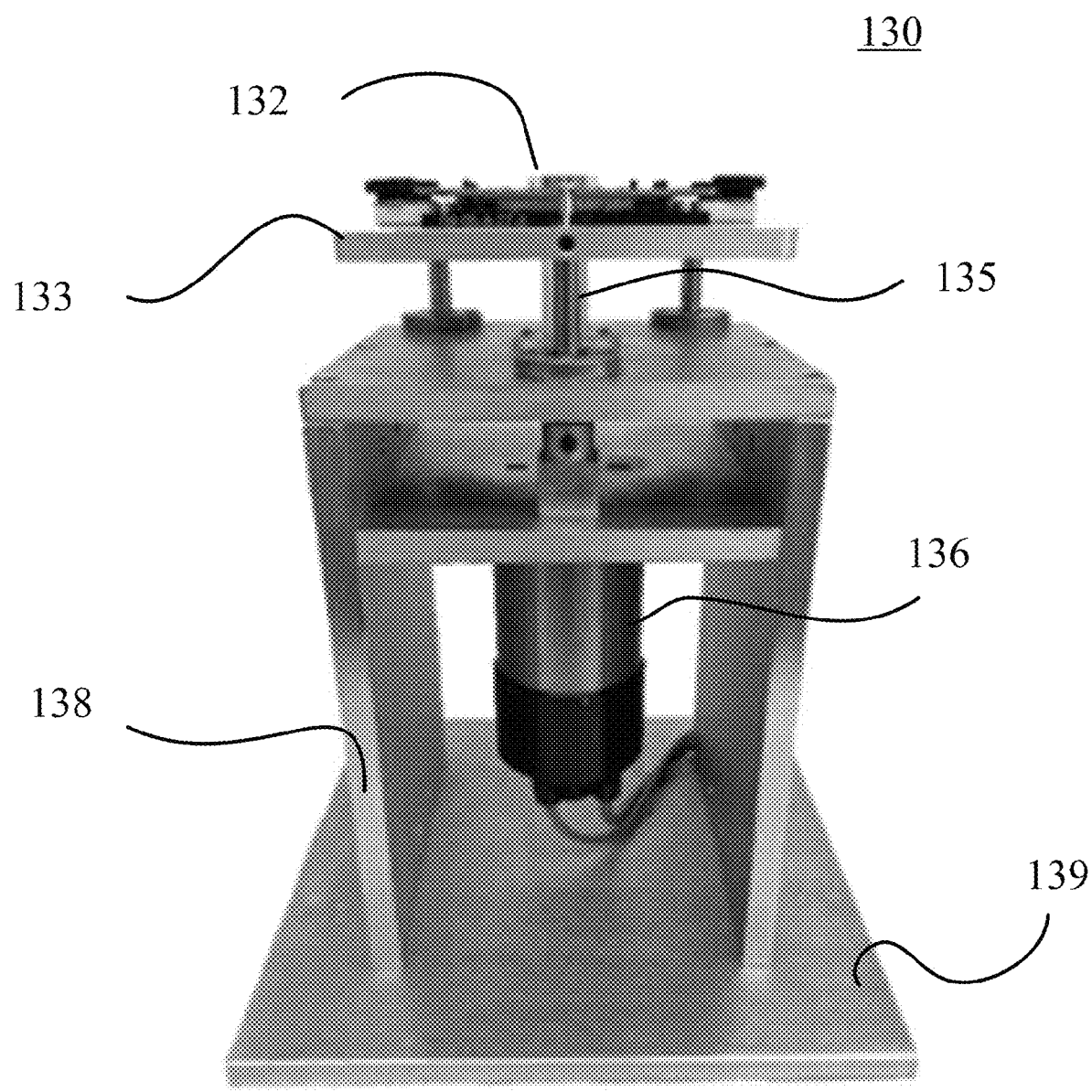
FIG. 7 is an overview of a mechanics module included in the MEASSuRE according to an embodiment of the present invention.

Next, FIG. 7 is an overview of the mechanics module 130 of the MEASSuRE 100 shown in FIG. 4. As shown in FIG. 7, the mechanics module 130 includes a supporting plate 133 supporting the interface board 160 seating an sMEA 132, if electrophysiological measurements is to be performed immediately before, after, or during stretching. The mechanics module 130 could also include a purely physical holder for the sMEA without electrical connections. An indenter 134 (see FIG. 8A) is position underneath the sMEA 132. The mechanics module 130 also includes a Voice Coil Actuator (VCA) 136 for controlling a lifting rod 135 to move the supporting plate 133 upwards and downwards (see FIG. 8A). The module 130 also includes a base 139 with sidewalls 138.

The mechanics module 130 offers variable strain rates and strain profiles (e.g., radial, linear, and custom). For example, depending on the type of VCA 136 that is used in the MEASSuRE, a strain rate of 1/s for strains up to 20%; a strain rate of up to 50/s for a strain up to 50%; and a strain rate of up to 80/s for a strain up to 50% can be provided. Thus, the cells can be stretched in a radial or uniaxial or other directions and can include one quick impulse stretch or cyclical stretching over days, weeks, or months.

The combination of the imaging module 110, the electrophysiology module 120 and the mechanics module 130 integrated into a single device includes several advantages. For example, a research scientist can compare pre-stretch and post-stretch of the cells using the electrophysiology module 120 and the imaging module 110 (the mechanics module 110 can be used to stretch the cells). In particular, the post-stretch electrophysiological activity can be normalized to a pre-stretch level, because the microelectrodes stretch with the cells and remain in contact with the same cells throughout the stretching motion. Further, the researcher can repeatedly stretch and relax the cells. That is, the microelectrodes elastically stretch with the cells, allowing for cyclic/repeated stretching to investigate the effects of repeated injuries (e.g., concussions), and for Organ-on-Chip (OoC) and regenerative medicine applications.

In addition, the research scientist can verify and measure the cell strain. In more detail, measuring the exact strain that the cells experience is advantageous for reproducible experiments. In the MEASSuRE, the cells remain in the focal plane of the lens of the imaging module 110 throughout the stretching process, and thus the strain of the cells can be more accurately measured and verified.

Also, mechanically stretching the sMEA also stretches the cells on the sMEA. Thus, in an injury mode, the MEASSuRE 100 replicates the biomechanics of a TBI by mechanically deforming the cells on the sMEA. The embedded stretchable electrodes enable the direct assessment of the neuronal health and function before and after the injury. Thus, in addition to all benefits of the physiological mode, the MEASSuRE 100 enables research on TBI as a risk factor to develop AD/ADRD for people with or without a preexisting genetic disposition.

Figure 8A:
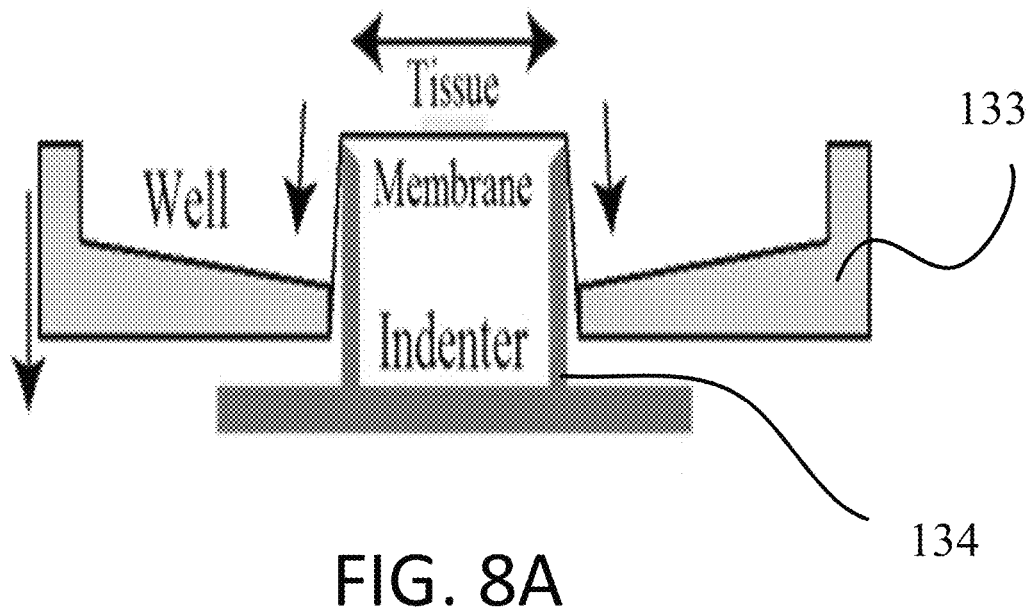
FIGS. 8A and 8B are overviews illustrating how the sMEA is stretched according to an embodiment of the present invention.

Next, FIG. 8A illustrates how the supporting plate 133 of the mechanics module 130 is moved downwards so the indenter 134 presses upwards against the sMEA. That is, the cells are stretched by pulling the elastomeric (e.g., silicone) membrane with the embedded microelectrodes over the indenter 134. Further, the electrodes stretch with the tissue, thus the neural activity can be recorded before and after stretching from the same location.

Figure 8B:
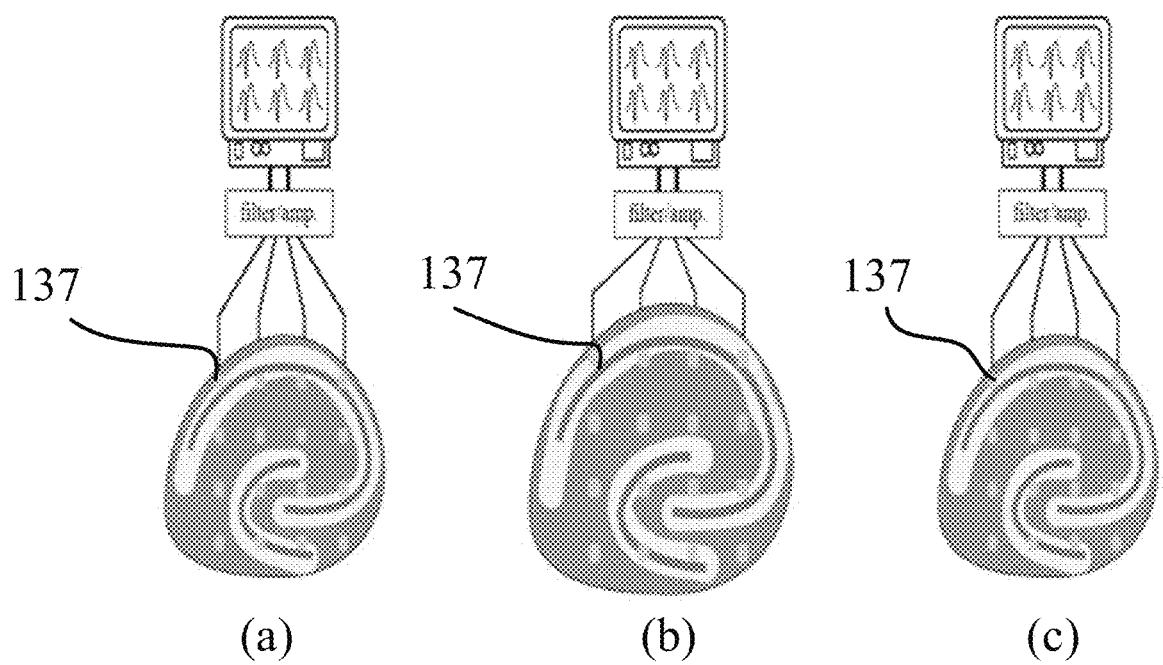

The mechanics module 130 applies a strain to the cells, the electrophysiology module 120 is used to compare pre-stretch and post-stretch electrophysiological activity of the cells, and the imaging module is used to record images of the cells before, during, and after the stretch. That is, the mechanics module 130 in combination with the electrophysiology module 120 and the imaging module 110 allows for the normalization of post-stretch electrophysiological activity of the cell/tissue to pre-stretch level because as shown in FIG. 8B, the microelectrodes 137 on the sMEA 132 stretch with the cells/tissue. That is, the microelectrodes 137 remain in contact with the same location on the tissue (or cell culture) before, during and after stretching.

Further, the cells can be repeatedly stretched and relaxed. That is, the microelectrodes of the sMEA elastically stretch with the tissue, allowing for cyclic or repeated stretching. This capability is particularly advantageous for the investigation of the effects of repeated injuries (e.g., concussions), and for OoC and regenerative medicine applications.

Also, tissue strain verification is possible. That is, the strain that the cells experience depends on the strength and uniformity of cell adhesion to the underlying silicone membrane and is not necessarily the same as the strain on the substrate of the sMEA, which depends on the displacement over the indenter. According to the embodiments of the present invention, it is possible to determine exactly by how much the cells have been stretched. By design, the cells remain in the focal plane of the lens during stretching, i.e., cells can be imaged throughout the stretching process with the built-in high speed camera. Image analysis code such as MATLAB-based image analysis software can then be used to calculate the strain of the cells using these images.

Further, the VCA 136 in FIG. 7 produces the motion to generate the strain on the sMEA 132 and tissue by pulling the stretchable section of the stretchable MEA 132 over the cylindrical indenter 134 (as shown in FIG. 8A). A position sensor that is built into the VCA 136 and a PID position controller allow a precise closed-loop motion control. Also, any stretch pattern within the limits of the VCA 136 with respect to acceleration, velocity, and stroke, can be programmed using macros. The mechanics module 130 also produces strains of up to 50%. Further, the mechanics module 130 can also produce sufficiently high velocity and acceleration for very high strain rates of >80/s, for example, because of the use of the VCA 136 to produce the stretch motion. In addition, the mechanics module 130 can produce both radial and linear strain by changing the type of indenter over which the stretchable MEA is pulled (see FIG. 9A which illustrates different indenters to produce both radial and liner strain).

The VCA 136 is advantageous over a pneumatic system or a motor to produce the strain, because the vacuum suction in the pneumatic system cannot be as precisely controlled as there is no position sensor feedback in the stretched membrane (no closed loop), i.e., the applied strains and strain rates are less reproducible. The motor-controlled systems also do not have a closed-loop feedback between position (i.e., strain) and motor output.

Further, any stretch pattern within the limits of the VCA 136 regarding acceleration, velocity, and stroke, can be programmed using macros through the software. The MEASSuRE platform produces velocity and acceleration for very high strain rates of 80/s because of the use of the low friction VCA 136 to generate the motion. The MEASSuRE 100 can also produce radial, linear, and custom strain profiles with the same tool. Only the type of indenter over which the sMEA is pulled needs to be exchanged.

In addition, as shown in FIG. 8B, with the combination of mechanical stretching and electrical stimulation of the cells, and image recording the stimulation, it is possible to advantageously assess cell health and maturity. For example, as shown in FIG. 8B(a), the electrodes record neural activity prior to cell stretching. As shown in FIG. 8B(b), the stretchable electrodes move with the tissue during the stretching motion. Finally, as shown in FIG. 8B(c), after stretching, the stretchable electrodes record neural activity from the same location as before the stretching motion.

Figure 9A:
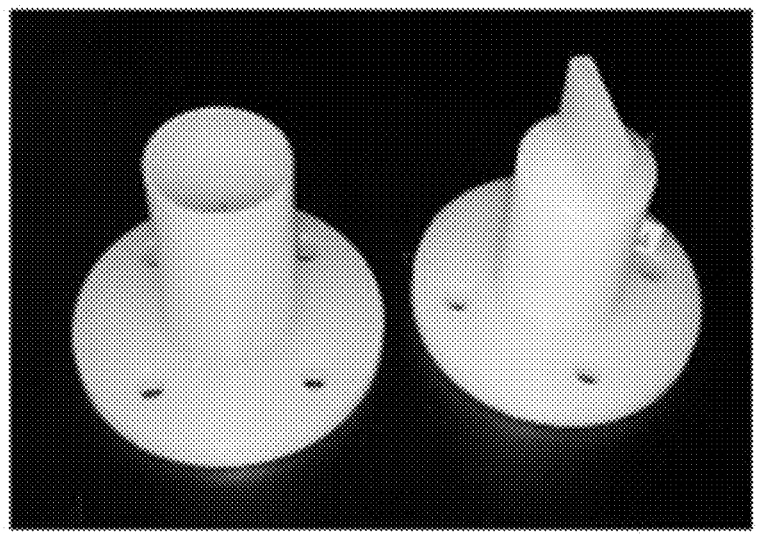
FIGS. 9A and 9B are overviews illustrating accessories included with the MEASSuRE according to an embodiment of the present invention.
Figure 9B:
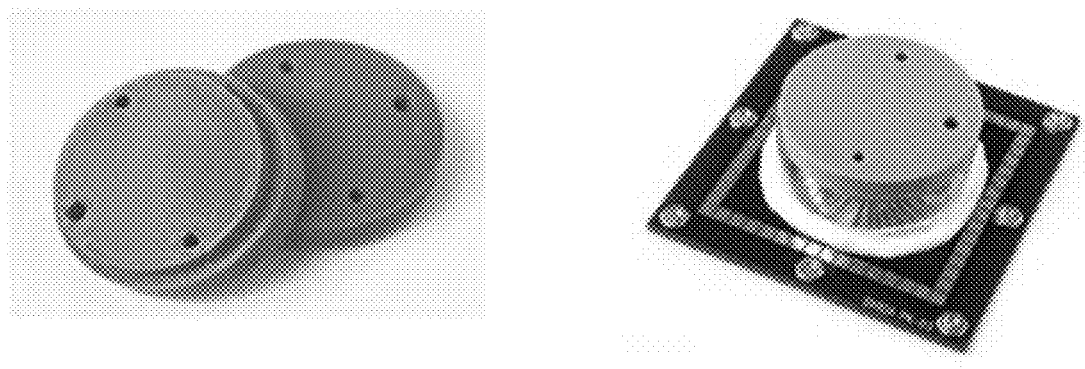

Next, FIGS. 9A and 9B illustrate accessories included with the MEASSuRE 100. For example, FIG. 9A illustrates different indenters that can be easily switched in an out to quickly provide different strain profiles for cell stretching. FIG. 9A(a) illustrate an indenter for producing a radial strain profile, and FIG. 9A(b) illustrates an indenter for producing close to a uniaxial strain profile. FIG. 9B illustrates sMEA caps that can be used to cover media to maintain sterility and prevent splashing. The sMEA caps also protect the cells during the stretching motion. FIG. 9B(a) illustrate two sMEA caps and FIG. 9B(b) illustrates an sMEA cap installed on an sMEA.

As discussed above, there is a gap between pre-clinical drug screening and clinical trials (e.g., twenty compound candidates showed evidence of benefits in pre-clinical trials for treating AD/ADRD, but all candidates failed in Phase III clinical trials, and none was FDA approved). Currently available treatments for AD/ADRD patients only help manage the symptoms of the disease, but there is no cure. Without a treatment to stop or reverse the progression of the disease, the number of Americans living with AD/ADRD is projected to grow from 5.8 million today to 13.8 million by 2050.

In addition, studies have found epidemiological evidence that a history of traumatic brain injury (TBI) increases the risk of later developing AD/ADRD. Notably, the Amyloid β (Aβ) plaques produced following a TBI are similar to those observed in early stages of AD/ADRD. Furthermore, repetitive mild TBI may lead to permanent degenerative changes including chronic traumatic encephalopathy and Alzheimer's disease. Other theories linking TBI and AD/ADRD include neuronal loss, persistent inflammation, and cytoskeletal pathology. Therefore, better understanding the complex relationship between AD/ADRD and TBI, as well as the role of genetics and environmental risk factors, will lead to a significant improvement in treating AD/ADRD and TBI.

The embodiments of the present invention advantageously better represent the biochemical, bioelectrical, and biomechanical environment of cells in the human body. That is, as described above, the MEASSuRE 100 includes a mechanics module that can be used to mechanically stretch and strain the cells to replicate the natural (i.e., non-pathological) strain in the body. In addition, the MEASSuRE 100 further includes an electrophysiology module that can be used to electrically stimulate the cells that more closely mimic the electrical activity of the cells in the body and also to record the cell responses to the electrical stimulation. The imaging module 110 can also be used to record and capture the mechanical and electrical activity of the cells in vitro.

Figure 10A:
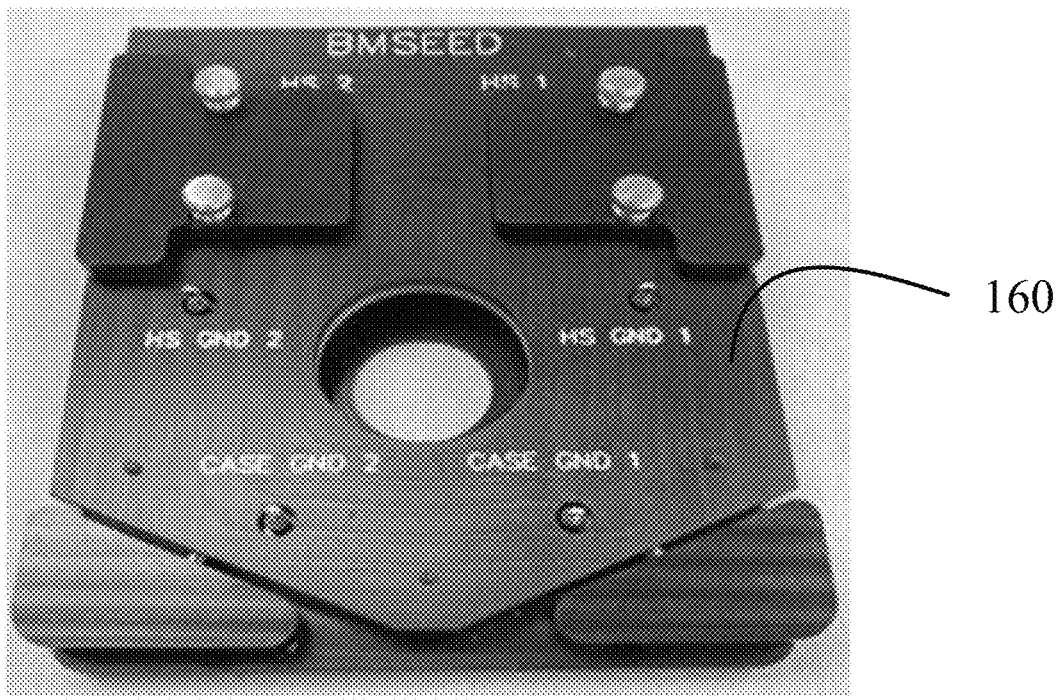
FIGS. 10A-10D are overviews illustrating an interface board and an sMEA according to different embodiments of the present invention.
Figure 10B:
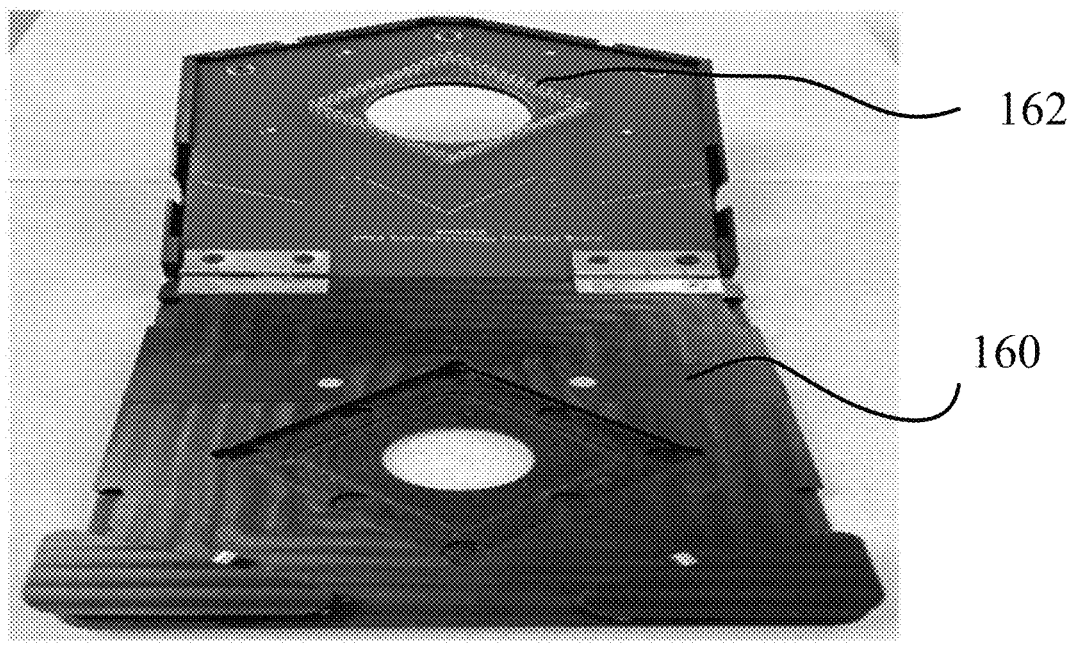
Figure 10C:
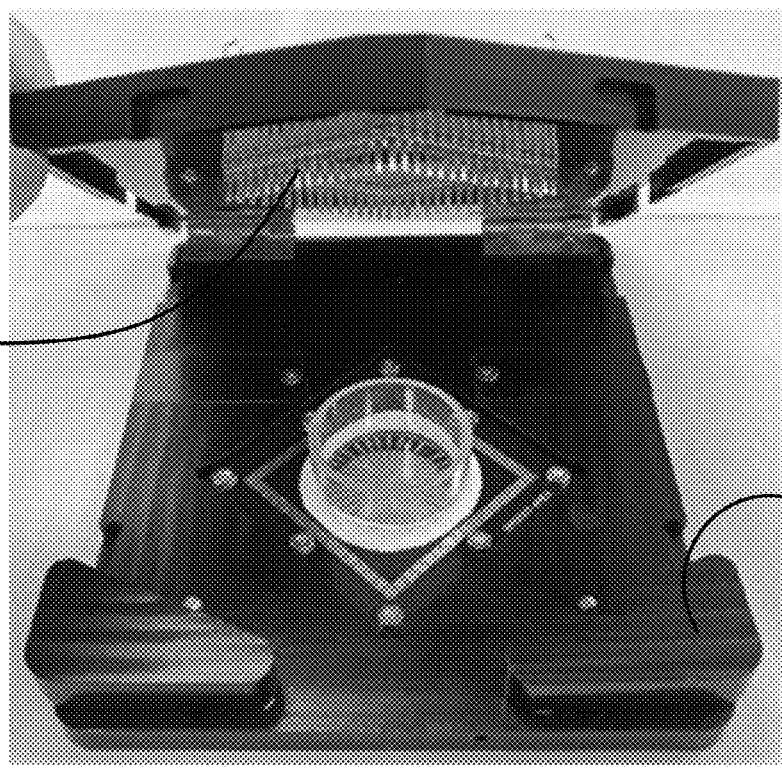
Figure 10D:
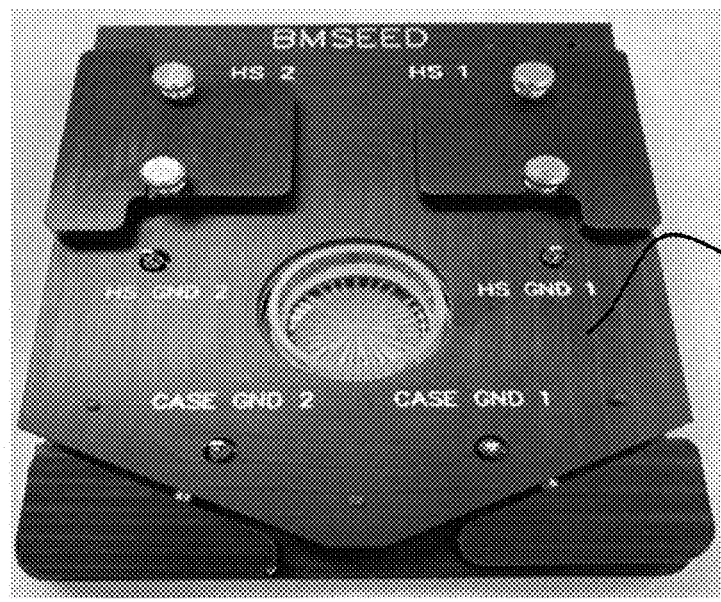

Next, FIGS. 10A-10D are overviews illustrating an interface board 160 for securing an sMEA and providing an interface between the sMEA and the MEASSuRE 100. In particular, FIG. 10A illustrates the interface board 160 closed with no sMEA, FIG. 10B illustrates the interface board 160 open with no sMEA, FIG. 10C illustrates the interface board open with an sMEA, and FIG. 10D illustrates the interface board 160 closed with an sMEA. The interface board 160 including the sMEA is then placed within the MEASSuRE system 100 for applying electrical stimulation to cells in the culture disposed on the sMEA, for stretching the cells, for recording electrical responses of the cells, and for imaging the cells.

In addition, as shown in FIG. 10A, the interface board 160 also includes the appropriate terminals such as ground terminals (HS GND 1, HS GND 2, CASE GND 1 and CASE GND 2) and input and output terminals (HS 1 and HS 2) for providing electrical stimulation and recording operations. Further, as shown in FIGS. 10B and 10C, the interface board 160 includes pogo pins 162 that make electrical contact with the contact pads on the sMEA. Each pogo pin 162 can be individually controlled to apply electrical stimulation to cells included in the cell culture, and individually controlled to record electrical responses of the cells.

FIG. 10C also illustrates how the pogo pins 162 connect in one-to-one manner with the contact points of the contact pads 48 of the sMEA. In addition, FIG. 10D illustrates the sMEA mounted within the interface board 160 such that the interface board 160 including the sMEA can be placed within the MEASSuRE. The controllers/processors of the MEASSuRE can then control the mechanics module 130 to stretch the cells, control the electrophysiology module 120 to electrically stimulate the cells and to record electrical responses of the cells, and control the imaging module 100 to capture images of the cells. The differentiation of stem cells into a specific cell type is also regulated by microenvironmental cues, such as chemical factors in addition to the above-described mechanical forces and electrical fields.

Figure 11:
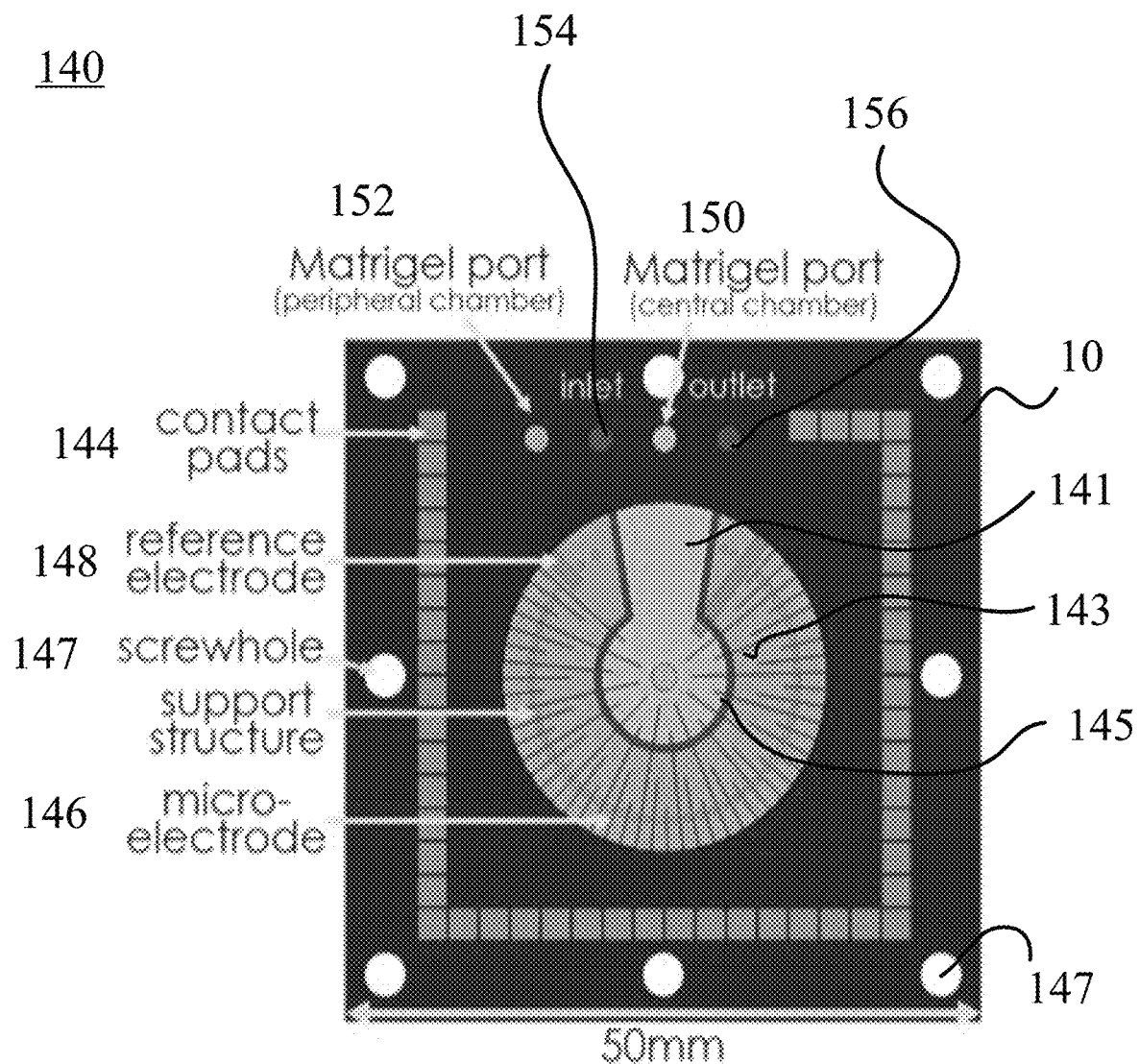
FIG. 11 is an overview of a 3D sMEA with multiple chambers and a microfluidic channel according to an embodiment of the present invention.

Accordingly, an additional embodiment of the present invention includes a 3D sMEA with two chambers and a microfluidic channel for supplying a biochemical. In particular, FIG. 11 is an overview of an additional embodiment of a 3D soft and stretchable MEA (3D sMEA) 140. As shown, the 3D sMEA 140 includes two chambers 141 and 143, which enables the investigation of single cell types and of neuronal crosstalk with microglia and astrocytes. The dual chamber design is a particularly advantageous factor in mediating changes in neuronal electrophysiology, viability, and synaptic density. Further, cells from various sources can be investigated, e.g., from human induced-pluripotent stem cells (hiPSC) from healthy individuals and those with AD/ADRD, as well as from wild type and genetically modified animal models.

In more detail, FIG. 11 illustrates a 3D sMEA 140 including a central chamber 141 and a peripheral chamber 143 separated by a microfluidic channel 145. The central chamber 141 and peripheral chamber 143 can include a 3D matrigel matrix. The 3D matrigel matrix can then be fed drug candidates, for example, via a central chamber port 150 and a peripheral port 152. The 3D matrigel matrix can be fed into the chambers with pipettes, for example. That is, the central and peripheral chambers 141 and 143 can be filled with a 3D neuronal culture and a 3D microglia/astrocyte co-culture, respectively, both in a Matrigel extracellular matrix. The culture can also be formed into a 3D shape. That is, the 3D matrigel matrix refers to the cells being arranged in a 3D matrix composed of Matrigel or a hydrogel. The cells are suspended in the Matrigel in 3D and as such injected through the Matrigel ports 150 and 152 separately into the central chamber 141 and the peripheral chamber 143.

Further, as shown in FIG. 11, the microelectrodes 146 in the 3D-sMEA 140 extend to different chambers 141 and 143 and allow for the assessment of neuronal health and function. Also, the 3D-sMEA in FIG. 11 is interfaced with a perfusion module added to the MEASSuRE 100 to control the flow of medium loaded with drug candidates, for example, through the microfluidic channel 145. The perfusion module is discussed in more detail in FIG. 19.

In addition, the microfluidic channel 145 includes an inlet port 154 and an outlet port 156. Thus, biochemicals such as nutrients, biomarkers, oxygen, or drugs, for example, can be introduced into the microfluidic channel 145 via the perfusion module added to the MEASSuRE 100. The microfluidic channel 145 advantageously allows a researcher to control the biochemical environment (nutrients, biomarkers, oxygen, drugs) in the cell culture, e.g., to reproduce conditions that cause vascular degeneration and neuroinflammation.

Further, the sMEA 140 includes a stretchable substrate such as an elastomeric substrate (e.g., a silicone substrate) embedded with stretchable electrodes 146 and 148, which more accurately mimics the environment in vivo than cell culture platforms made of plastic or glass. That is, the soft and stretchable electrodes 146 and 148 enable the functional assessment of neuronal health in situ. In particular, FIG. 11 illustrates the sMEA 140 including forty-eight microelectrodes 146 and two reference electrodes 148. The 3D sMEA 140 also includes contact pads 144 and mounting holes 147 for the mounting portions 49.

Figure 12A:
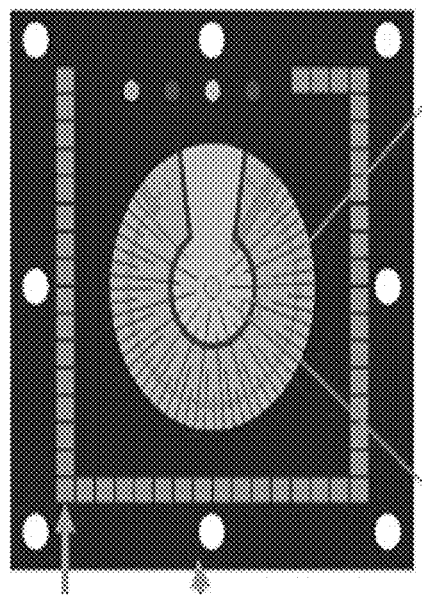
FIGS. 12A-12C are overviews of a microfluidic channel included in an sMEA with two chambers according to an embodiment of the present invention.
Figure 12B:
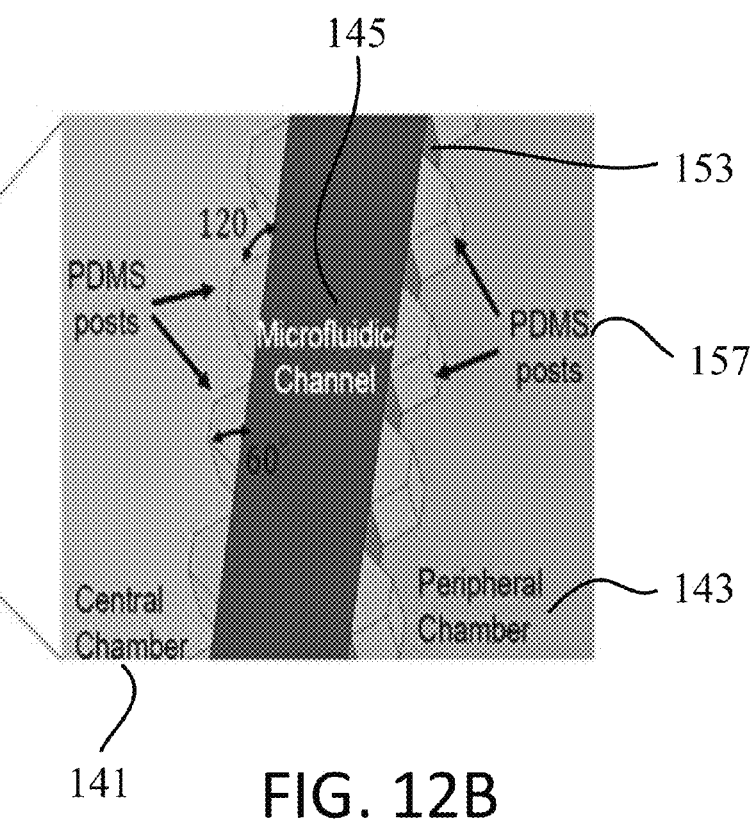
Figure 12C:
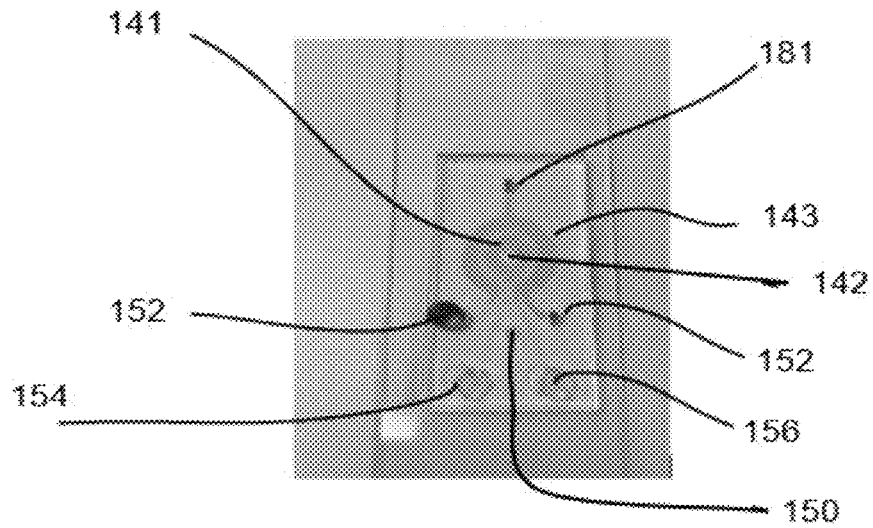

Next, FIGS. 12A-12C illustrate further details of the microfluidic channel 145. In more detail, FIG. 12B illustrates the microfluidic channel 145 is formed via PDMS (polydimethylsiloxane) posts 157. In addition, inclined surfaces of the PDMS posts 157 are inclined 60 degrees from the microfluidic channel 145, which keeps the Matrigel in the central and peripheral chambers from entering, and thus blocking, the channel. The 60° angle is preferably selected to complement the 120° contact angle of Matrigel on PDMS to 180°, thus preventing the Matrigel to move past the posts into the channel. Other angles can also be used.

Thus, the structure of the microfluidic channel 145 can be maintained. Further, the desired nutrients, etc. can be fed into the microfluidic channel 145. The nutrients can then enter into the central and peripheral chambers 141 and 143 via spacings between the PDMS posts by diffusion and convection.

FIG. 12C illustrates another example of the microfluidic channels of the sMEA (the microelectrodes are not shown). Preferably, the central chamber 141 is first filled with the cells suspended in Matrigel or another hydrogel. The cell suspension is injected through the inlet port 150 for the central chamber 141. The PDMS posts 157 prevent the Matrigel from entering, and blocking, the microchannel 145. The peripheral chamber 143 is then filled with the cells suspended in Matrigel or another hydrogel via one or more ports 152. The type of cells in the peripheral chamber 143 can be the same or different than the type of cells in the central chamber 141. The inlet and outlet ports 154 and 156 are used to fill the channel with the medium that provides the cells in the central and peripheral chambers with nutrients, oxygen, and compounds to be tested. Port 156 can be the inlet and outlet, and conversely, port 154 can be the outlet or the inlet. Excess volume of Matrigel, hydrogel, or medium can be removed with a pipette or by gently wicking it with a piece of tissue. An outlet 181 is also shown in FIG. 12C as well as a support post 142 illustrated in FIG. 13.

Figure 13:
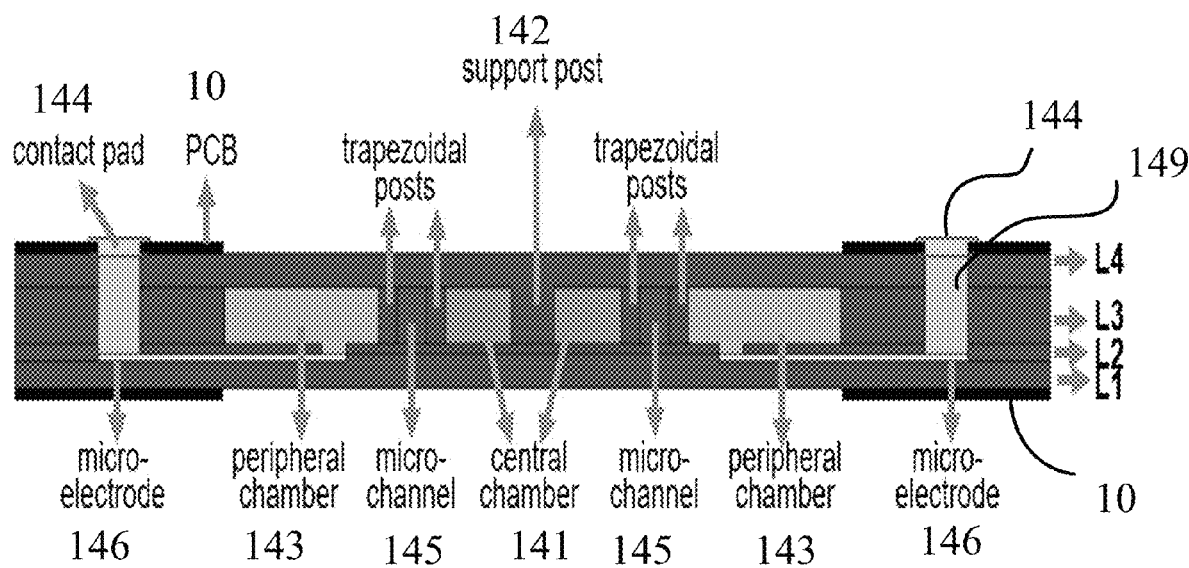
FIG. 13 is a cross-sectional side view of an sMEA with multiple chambers and a microfluidic channel according to an embodiment of the present invention.

Next, FIG. 13 is a cross-sectional side view of an sMEA with central and peripheral chambers 141 and 143 and a microfluidic channel 145 according to an embodiment of the present invention. As shown, the sMEA includes four layers L1-L4 with the contact pads 144 being formed on the top layer L4. Further, as shown, the microelectrodes 146 are formed on the first layer L1. There is an electrical connection established with silver paste 149 in vias 47 between the contact pad 144 on the PCB 10 and the microelectrode 146. The central and peripheral chambers 141 and 143 are also formed via opened areas with the third layer L3 (formed using a silicon wafer mold, for example). As shown in FIG. 13, the sMEA is compression bonded between printed circuit boards 10. Further, the printed circuit boards 10 include a central opening area such that the sMEA can be stretched via the indenter 134 pressing the sMEA through the central opening area of the printed circuit boards 10. In addition, as shown in FIG. 13, the central chamber 141 and the peripheral chamber 143 include ring-shaped internal passageways within the elastomeric substrate.

In addition, the trapezoidal posts formed in the third layer correspond to the PDMS posts 157 shown in FIG. 12B. A support post 142 is also shown in FIG. 13 and corresponds to a central portion of the sMEA as shown in FIG. 12A. FIG. 13 also illustrates the different layers L1-L4 of the sMEA, which will be described in more detail below referring to FIGS. 14A and 14B.

Figure 14A:
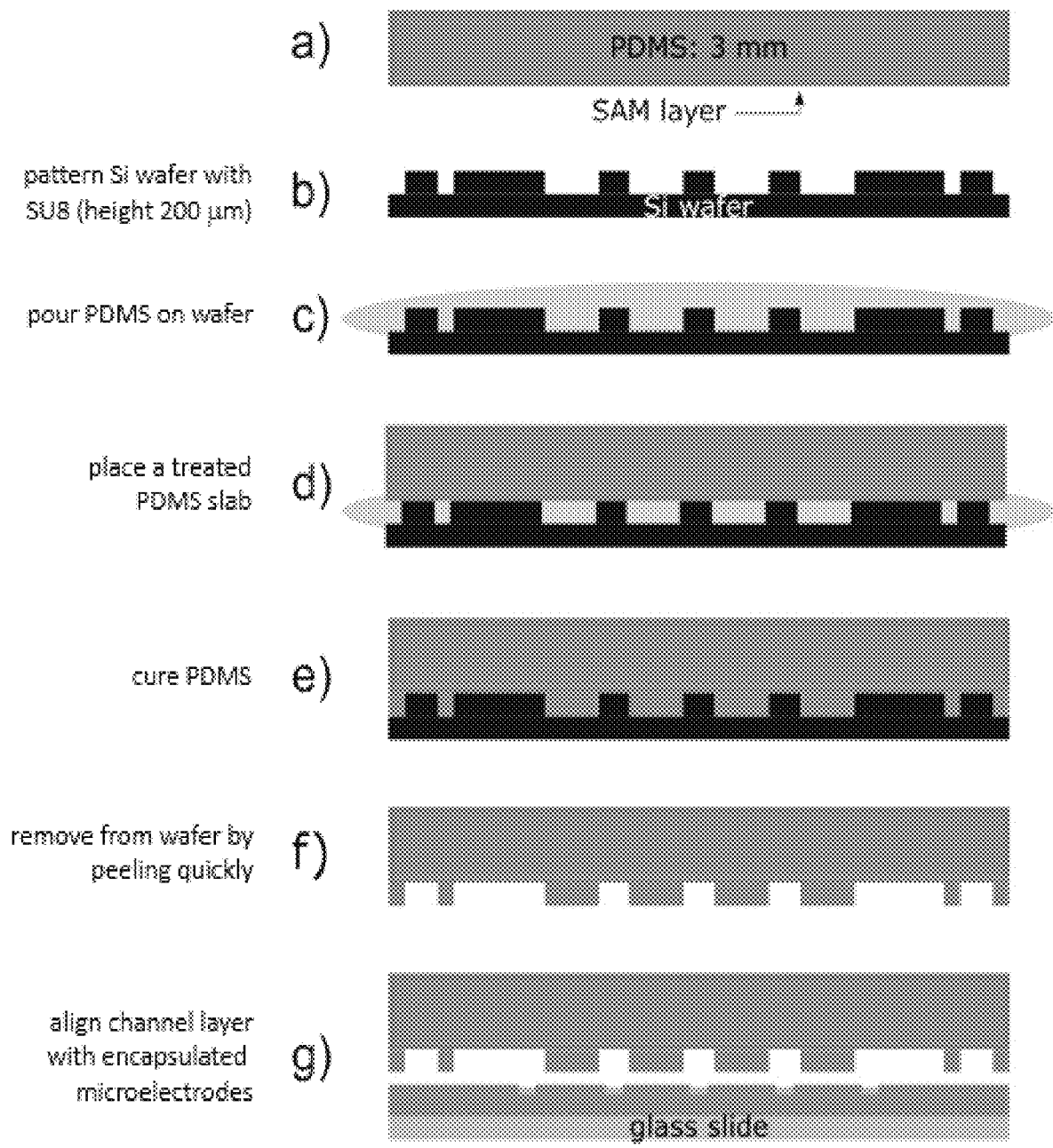
FIGS. 14A and 14B are overviews of a method of manufacturing an sMEA with multiple chambers and a microfluidic chamber according to an embodiment of the present invention.
Figure 14B:
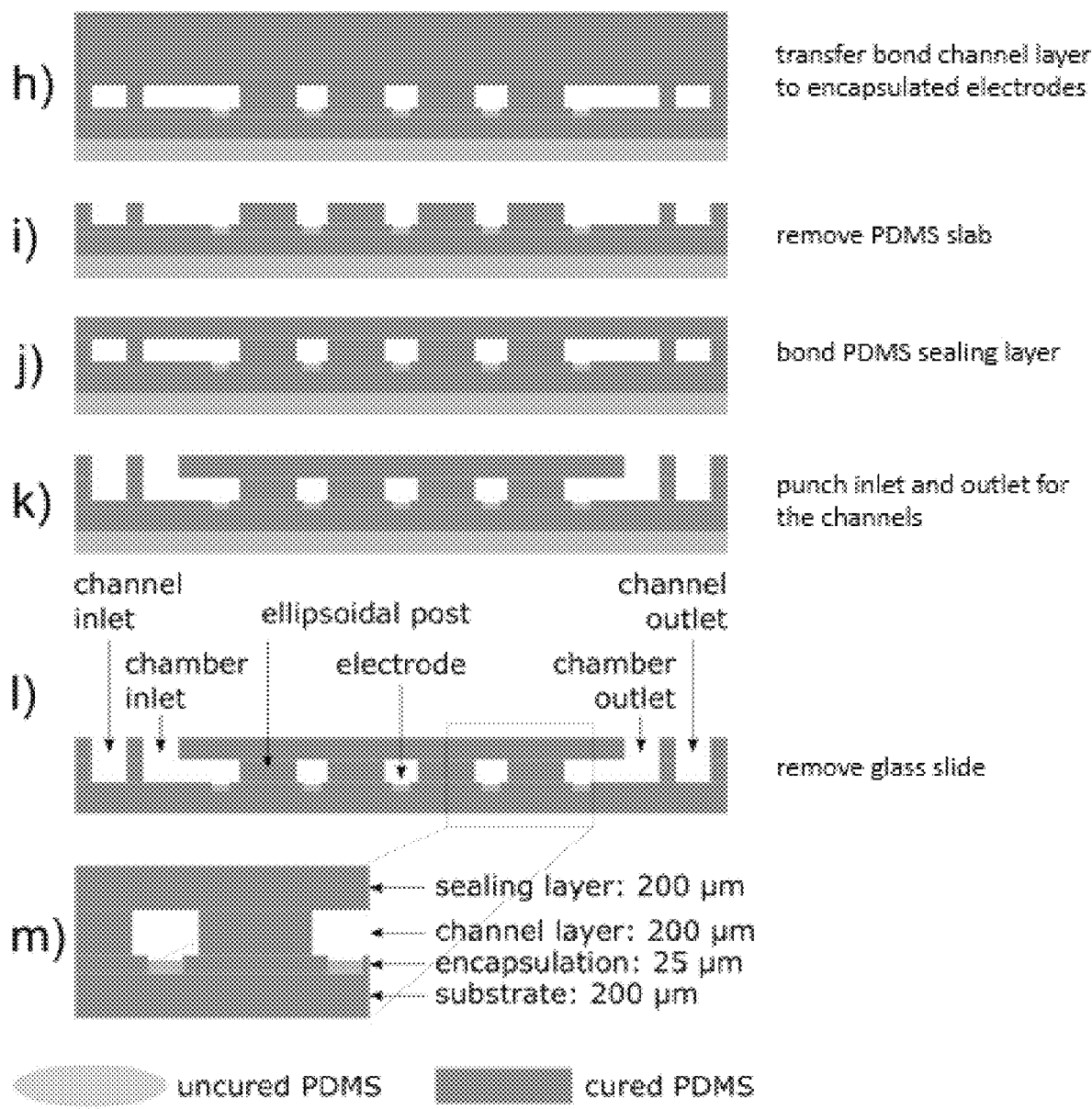

That is, FIGS. 14A and 14B are overviews of a method of manufacturing an sMEA with two chambers and a microfluidic channel according to an embodiment of the present invention. As shown, a PDMS substrate is formed (FIG. 14A(a), and a pattern Si wafer is prepared (FIG. 14A(b)). Uncured PDMS is poured on the patterned wafer (FIG. 14A(c)), and a 3 mm thick slab of cured, PFOTCS coated PDMS is placed on top (FIG. 14A(d)). After curing (FIG. 14A(e)), the PDMS slab is peeled quickly and removed from the wafer (FIG. 14A(f)), which leaves the thin encapsulation layer bonded to the slab due to the viscoelastic properties of the PDMS. The slab with the encapsulation layer is then transfer bonded to the PDMS substrate layer with the electrodes by exposing both surfaces to an oxygen plasma, aligning the contact holes on the encapsulation layer with the electrodes (FIG. 14A(g)), and bringing the two plasma-activated surfaces into physical contact (FIG. 14B(h)).

The PDMS slab is peeled slowly, which leaves the thin PDMS encapsulation layer bonded to the substrate (FIG. 14B(i)). This process is repeated with a second silicon wafer mold that replicates the channel layer (L3, (FIG. 14B(j)), which include the trapezoidal posts that delineate the microfluidic channel, the layout of the two chambers, and posts in the chambers for mechanical support for the subsequent PDMS sealing layer (L4). The sealing layer is produced in a similar manner with a third silicon wafer mold. The device is now peeled off the glass slide (FIG. 14B(1) and compression bonded between two PCBs with circular openings or through holes (FIG. 14B(m)).

The central and peripheral chambers are loaded with Matrigel containing the microglia/astrocyte co-culture and the neurons, respectively. The overall thickness is 425 µm: substrate (L1) 100 µm, encapsulation layer (L2) 25 µm, channel layer (L3) 200 µm, and sealing layer (L4) 100 µm. The diameter of the central chamber is 10 mm, the channel diameter is 400 µm, and the width of the peripheral chamber 7.5 mm. The recording sites of the microelectrodes are located alternatingly at distances of 2 mm and 4 mm from the channel.

Figure 15:
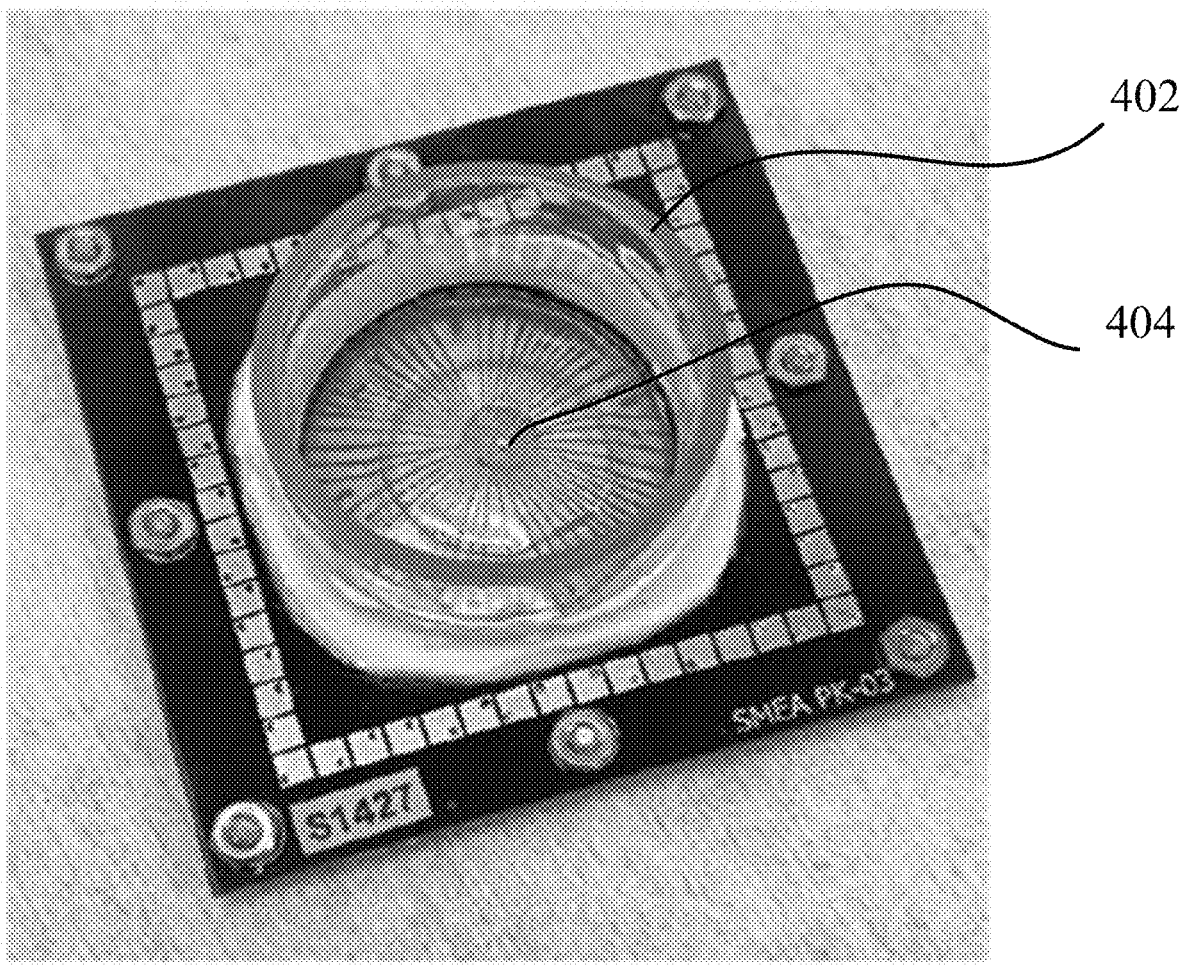
FIG. 15 is an overview of an sMEA with a permanent 3D pocket according to one embodiment of the present invention.

Next, FIG. 15 is an overview of a 3D sMEA 400 with a permanent 3D pocket 404 according to another embodiment of the present invention. FIG. 15 illustrates a single permanent 3D pocket in the center area of the well 402 to be concentric with the center of the sMEA. In addition, FIG. 15 illustrates a single 3D pocket, but it is possible to include multiple 3D pocket within one sMEA. Further, the 3D pocket can be formed in a variety of shapes including the spherical shape shown in FIG. 15. However, the 3D pockets can be formed with other shapes such as spherical, oval, oblong, semi-spherical, hemi-spherical, etc. The spherical shape is advantageous because the organoids are generally spherical shaped, and the spherical 3D pocket is particularly suited to maintain the organoid in its spherical shape (the organoid tends to remodel and flatten on flat surfaces).

Figure 16:
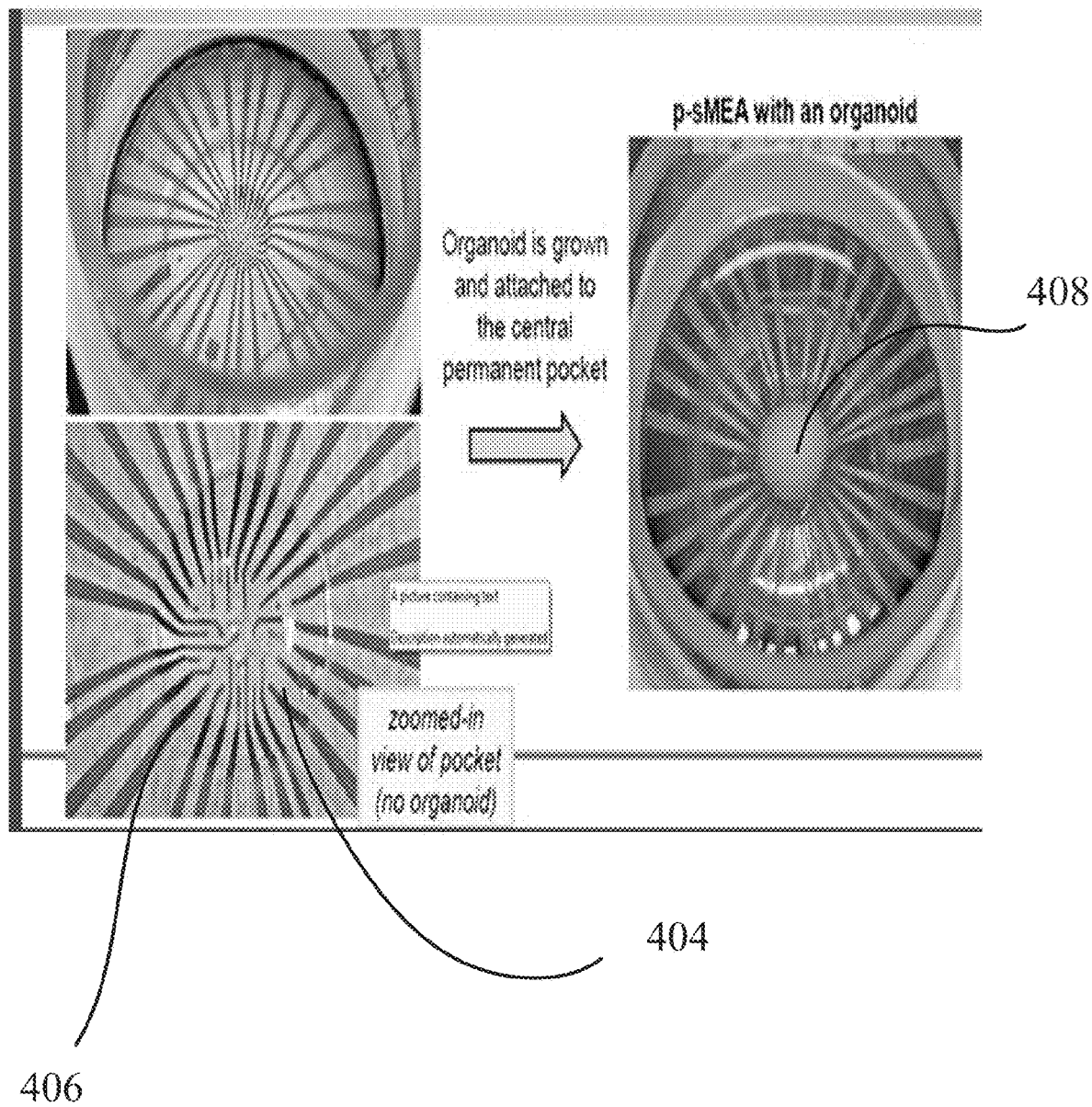
FIG. 16 is an overview of an sMEA with a permanent 3D pocket including an organoid according to one embodiment of the present invention.

FIG. 16 illustrates in further detail how the 3D pocket 404 can be used to grow a spherical organoid (e.g., brain organoid having a spherical shape) according to one embodiment of the present invention. As shown in FIG. 16, the organoid is grown and attached to the central permanent pocket 404. FIG. 16 also illustrates a zoomed-in portion showing the 3D pocket 404 and also stretchable microelectrodes 406 following a shape of the 3D pocket 404. That is, the stretchable microelectrodes 406 embedded within the stretchable substrate also stretch and change in shape with the sMEA substrate. Thus, according to one embodiment of the present invention, the sMEA can be advantageously formed with at least one 3D pocket 404.

Figure 17A:
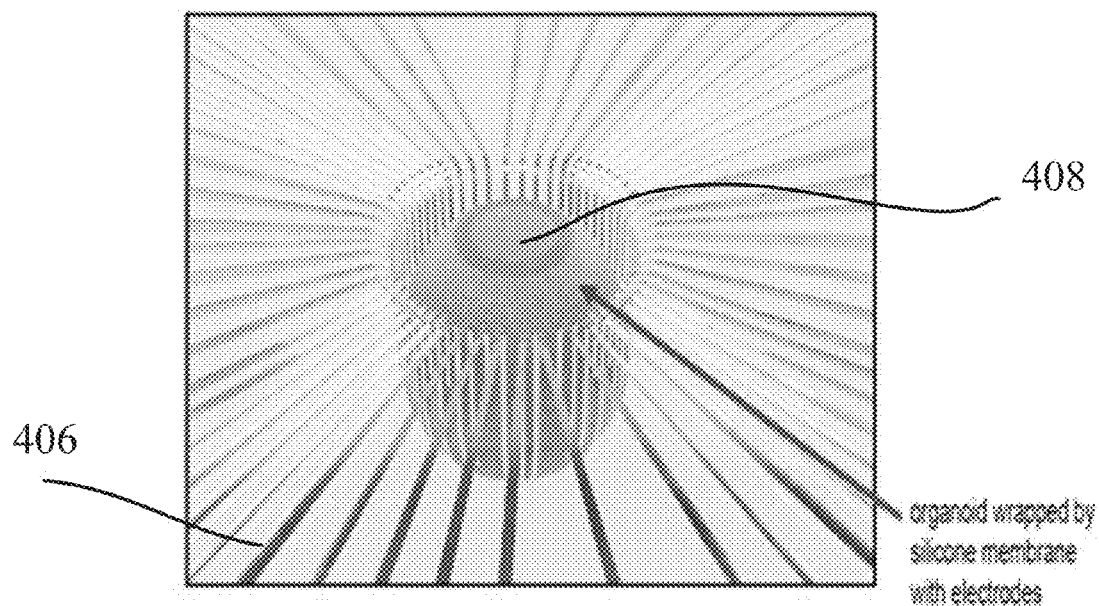
FIG. 17A is a 3D view of an organoid wrapped in a 3D pocket of an sMEA according to one embodiment of the present invention.
Figure 17B:
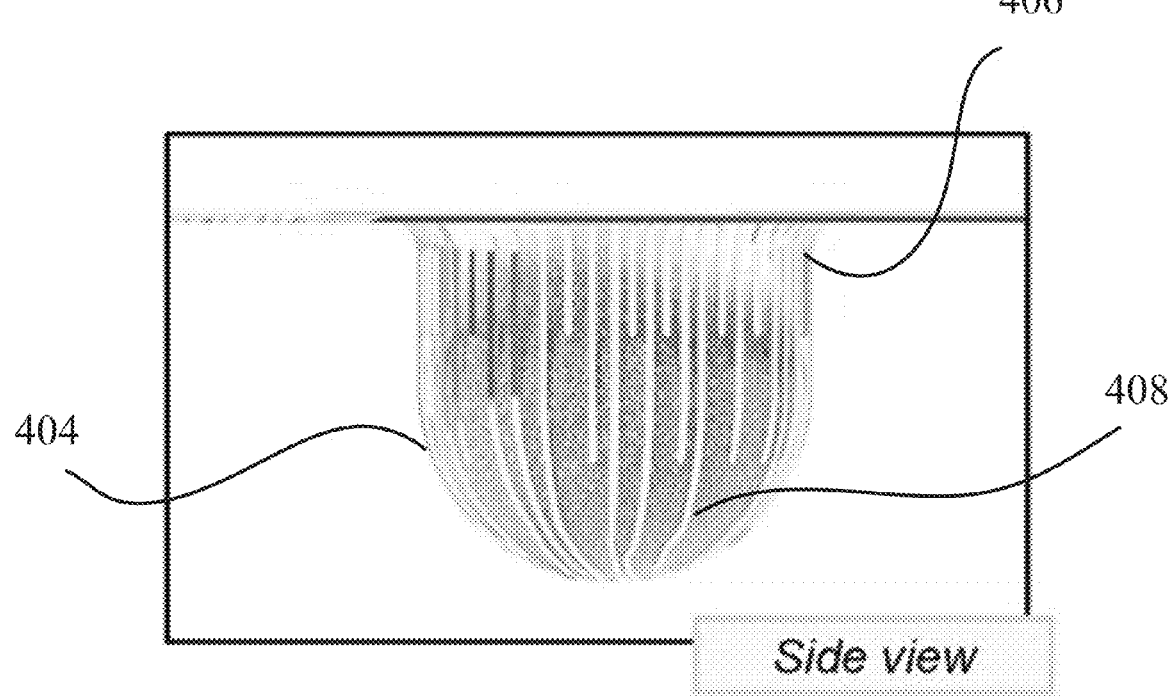
FIG. 17B is a side view of an organoid wrapped in a 3D pocket of an sMEA according to one embodiment of the present invention.

As shown in FIGS. 17A and 17B, the microelectrodes 406 contained within the 3D pocket 404 have a shape corresponding to that the of the 3D pocket 404. Thus, the microelectrodes 406 wrap and surround the circumference portions of the grown organoid. Further, the microelectrodes 406 contained within the 3D pocket 404 have varying lengths (e.g., some microelectrodes 406 extend to a center of the pocket 404, some microelectrodes 406 extend only partially to a bottom surface of the pockets, etc.).

In more detail, FIGS. 17A and 17B are close up views of how the microelectrodes 406 wrap an organoid 408 grown in the pocket 404. As shown in FIGS. 17A and 17B, because the sMEA is formed with a stretchable substrate and the microelectrodes are formed of microcracked gold films, for example, the 3D pockets can be advantageously formed by changing the shape of the sMEA.

FIG. 17B also illustrates the advantageous placement of the microelectrodes 406 to have different lengths and widths such that a maximum number of microelectrodes 406 can be accompanied in a small pocket area. Thus, with reference to FIG. 17B, the electrical activity of cells on the side surfaces of the 3D organoid can be recorded using microelectrodes that cover its side surfaces. Further, the electrical activity of cells on the bottom surfaces of the 3D organoid can be recorded using microelectrodes that cover the bottom surfaces. Thus, multiple surfaces of the 3D grown organoid can be recorded and/or applied with electrical stimulation.

Thus, as shown in FIGS. 15-17, the exposed portion of the microelectrode array comprises a 3D pocket lined with stretched microelectrodes for electrically stimulating and recording signals from an organoid placed in the 3D pocket. That is, the microelectrodes within the 3D pocket are stretched more than the microelectrodes in an area outside the 3D pocket. The microelectrodes are stretched via the suction force of the vacuum tube.

Figure 18A:
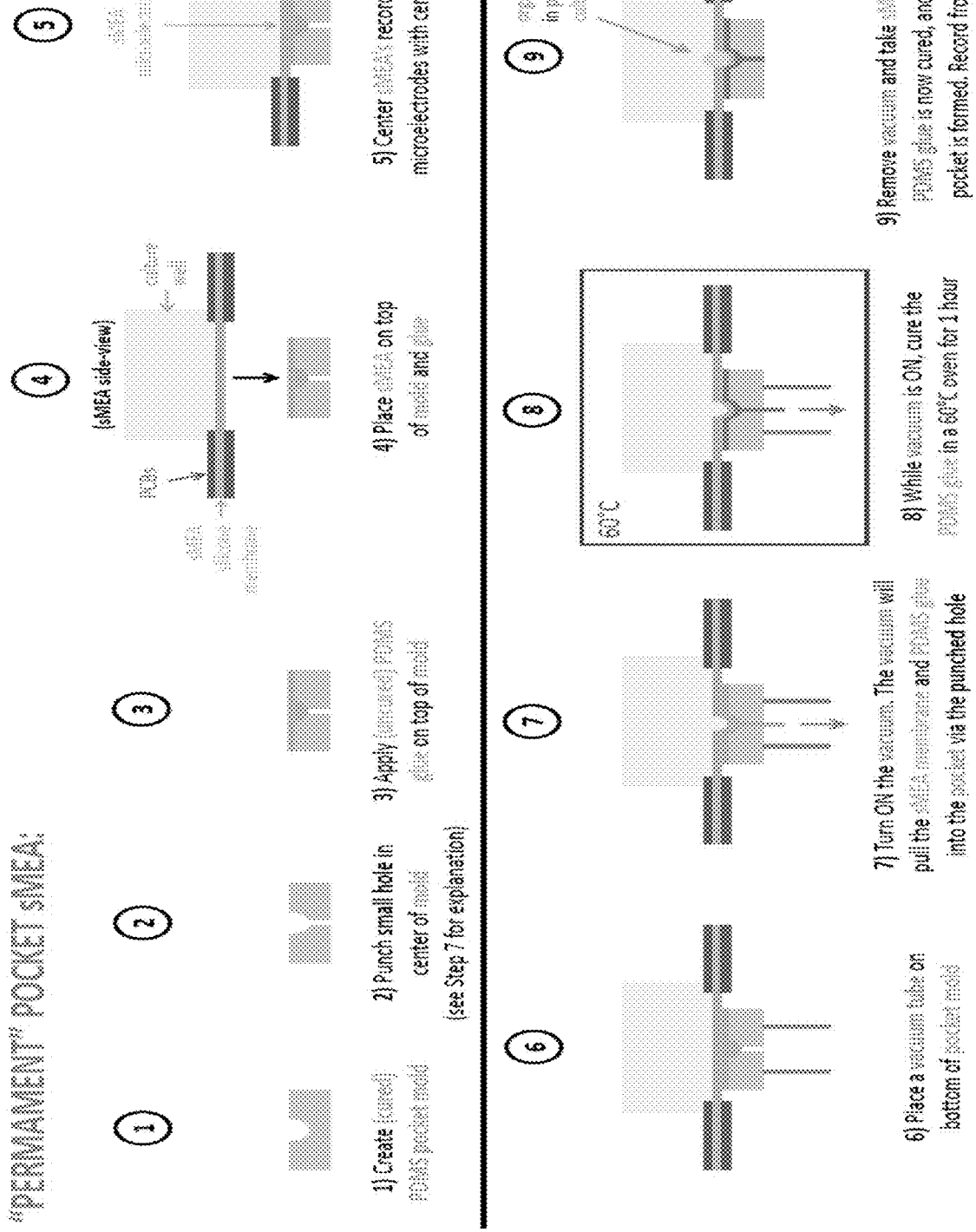
FIGS. 18A and 18B are flow diagrams illustrating a method of forming a permanent 3D pocket according to one embodiment of the present invention.
Figure 18B:
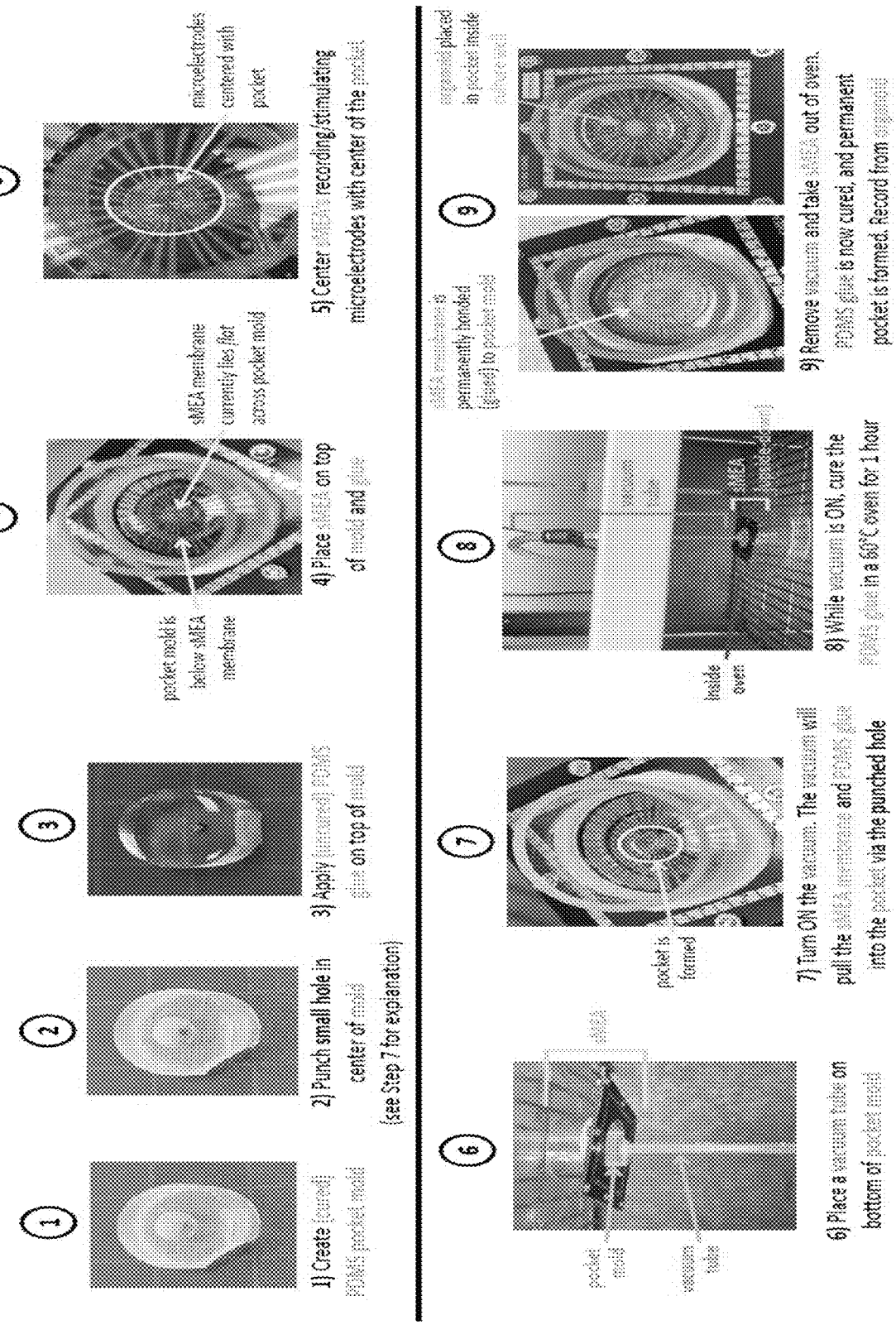

In addition, 3D pockets can be formed by making permanent pockets of fixed dimensions (width and depth) as shown in FIGS. 18A and 18B. The permanent pocket dimensions depend on the dimensions of the mold used to form the pockets. That is, the central portion of the sMEA is permanently bonded to the mold.

A vacuum suction can also be used to make temporary 3D pockets of flexible dimensions as shown in FIGS. 18C-18E. The flexible pockets can be created by vacuum suction in which a vacuum tube connected to a vacuum pump is placed underneath the central section of the sMEA. The diameter of the tube determines (and is equal to) the diameter of the pocket. The applied vacuum determines the depth of the pocket, and the higher the suction pressure, the deeper the pocket.

One benefit of the permanent 3D pocket is that no additional vacuum equipment is required, and it is therefore easy to use. Many different shapes and sizes of permanent 3D pockets can also be manufactured. One benefit of the flexible 3D pocket is its flexibility as the diameter and depth can be variably adjusted, and follow, for example, the growth of the organoid. Flexible 3D pockets can also be used to compress the organoid by forming the 3D pocket diameter smaller than the organoid, which can be used as an in vitro model for traumatic brain injury and neurodegenerative diseases.

In more detail, FIGS. 18A and 18B are flow diagrams illustrating a first method of forming a permanent 3D pocket according to one embodiment of the present invention. In particular, the flow diagram in FIG. 18A includes cross-sectional views of elements used in the process of forming permanent 3D pockets, and FIG. 18B illustrates the same process steps, but uses actual images of the elements.

As shown in FIGS. 18A and 18B, a cured PDMS pocket mold is formed (step 1), and a small hole is punched in the center of the mold (step 2). An uncured PDMS adhesive or glue is then formed on top of the mold (step 3). The sMEA including the elastomeric membrane sandwiched between PCBs and a culture well is then placed on the adhesive on the top of the mold (step 4). The recording and stimulating microelectrodes of the sMEA are also centered or aligned with the center of the 3D pocket (step 5).

In steps 6 and 7, a vacuum tube is placed on the bottom of the pocket mold and the vacuum is turned on to pull the elastomeric membrane and PDMs adhesive into the 3D pocket via the punched hole. Then, while the vacuum is on, the PDMS adhesive is cured at 60° C. in an oven for one hour (step 8). The vacuum tube can then be removed and the sMEA can be removed from the oven. The PDMS adhesive is now cured, and the permanent 3D pocket is formed. The desired organoid can then be placed within the 3D pocket for analysis using the stimulating and recording microelectrodes, for example.

An alternative method of forming the 3D pockets is shown in FIGS. 18C-18E. In particular, FIG. 18C is a flow diagram illustrating a second method of forming a flexible 3D pocket according to one embodiment of the present invention. As shown in FIG. 18C, a vacuum tube is placed on a bottom of the stretchable elastomeric member of the sMEA (step 1). Then, the vacuum is turned on to create a suction force, which pulls down the silicone membrane into a 3D pocket shape (step 2). While the vacuum is still on, the organoid can be placed in the 3D pocket, and the organoid can be studied by applying electrical stimulation via some of the microelectrodes, and the responses of the organoid to this electrical stimulation can be recorded using other microelectrodes (step 3). The organoid can then be removed and the vacuum suction turned off with the stretchable silicone member returning to its initial flat state.

Figure 19A:
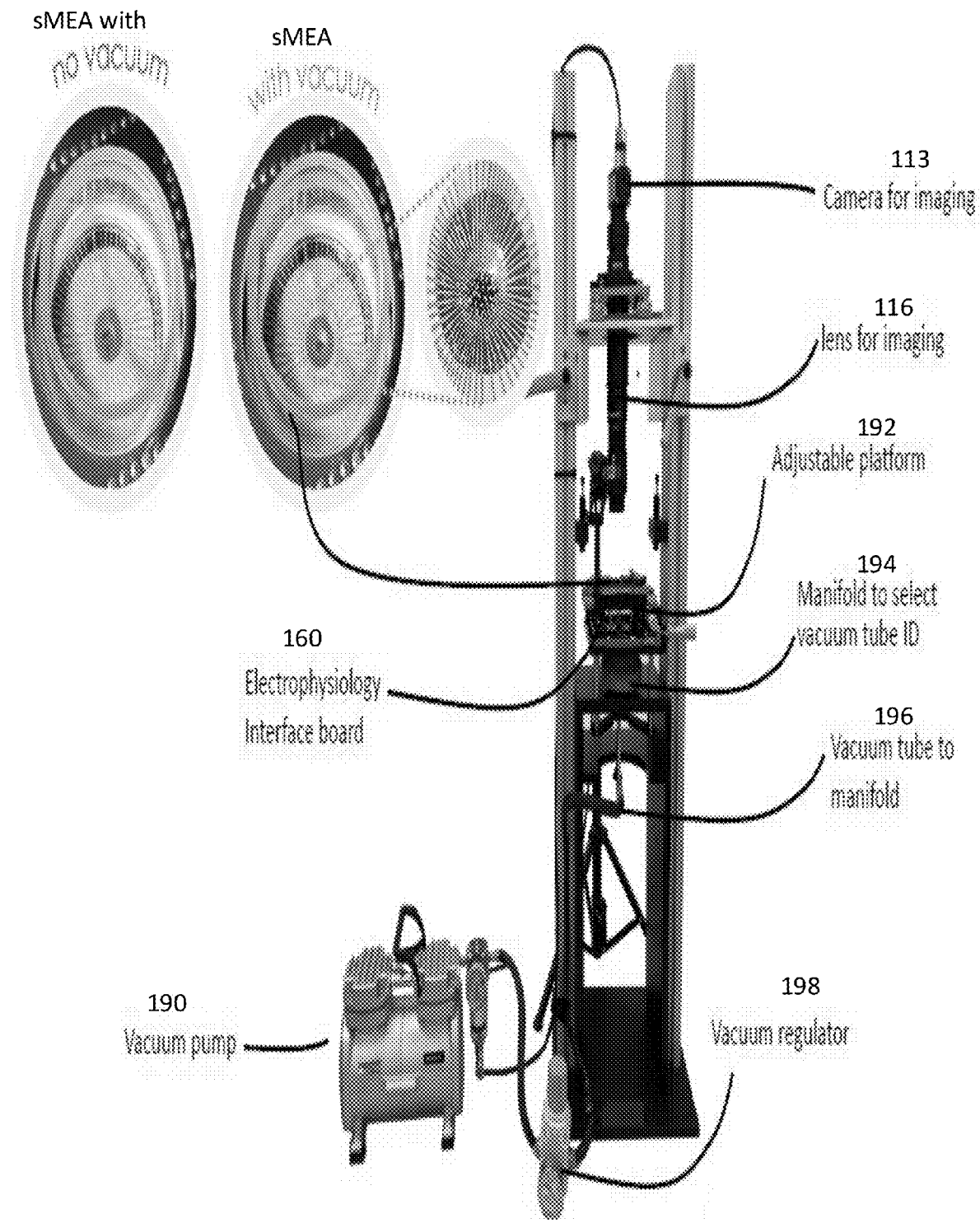
FIG. 19A is an overview illustrating a structural arrangement for forming a flexible 3D pocket shown in FIG. 18C.

FIG. 19A is an overview illustrating a structural arrangement for forming a flexible 3D pocket shown in FIG. 18C. As shown in FIG. 19A, the MEASSuRE can be adapted to include additional elements for forming a flexible 3D pocket. In particular, FIG. 19A illustrates the MEASSuRE including the camera 113 and lens 116 for imaging, and the interface board 160 mounted with an sMEA. The upper left portion of FIG. 19A illustrates the sMEA with no vacuum and no flexible 3D pocket. The upper right portion of FIG. 19A illustrates the sMEA with vacuum applied to form the 3D pocket.

In more detail, the additional elements for forming the flexible 3D pocket includes an adjustable platform 192, a manifold 194 to select a vacuum tube with specific inner diameter (ID), a vacuum tube 196, a vacuum regulator 198 and a vacuum pump 190. The vacuum tube 196 is positioned below the sMEA as described in FIG. 18C. The adjustable platform 192 enables the user to move the sMEA in x- and y-direction using micrometer screws to position the electrodes on the sMEA in the desired location with respect to the vacuum tube (which is mounted in a fixed position). Typically, the recording sites of the electrodes of the sMEA will be positioned inside the perimeter of the vacuum tube, or close by, that is, the electrodes will be distributed across the surface of the pocket when vacuum is applied to the sMEA via the vacuum tube. Furthermore, the adjustable platform 192 can also be moved in z-direction to move the sMEA closer or further away from the vacuum tube. This capability provides an additional mechanism to adjust the pocket shape and depth. In addition, the vacuum pump provides a provides a steady predetermined vacuum suction pressure that can be changed and regulated with the vacuum regulator 198. The vacuum regulator 198 can be a manual regulator, such as the SMC IRV20-LN11BG vacuum regulator from SMC Pneumatics, or an electronic regulator using an Arduino UNO controller in conjunction with a solenoid valve such as the EV-P-10-25A0-V from Clippard.

Thus, once the interface board 160 with the mounted sMEA is installed into the MEASSuRE, the vacuum pump 190 and regulator 198 can be controlled to provide a predetermined suction force to create a desired 3D pocket depth That is, the amount of suction force can be regulated using the vacuum regulator 198 such that the diameter and depth of the 3D pocket can be variably adjusted, and follow, for example, the growth of the organoid. The size of 3D pockets can also be reduced to compress the organoid. The diameter of the 3D pocket can also be easily changed by exchanging the vacuum tube that is used to create the pocket with another vacuum tube with a different diameter to create the pocket. This exchange is facilitated with the manifold 194 shown FIG. 19A.

Figure 19B:
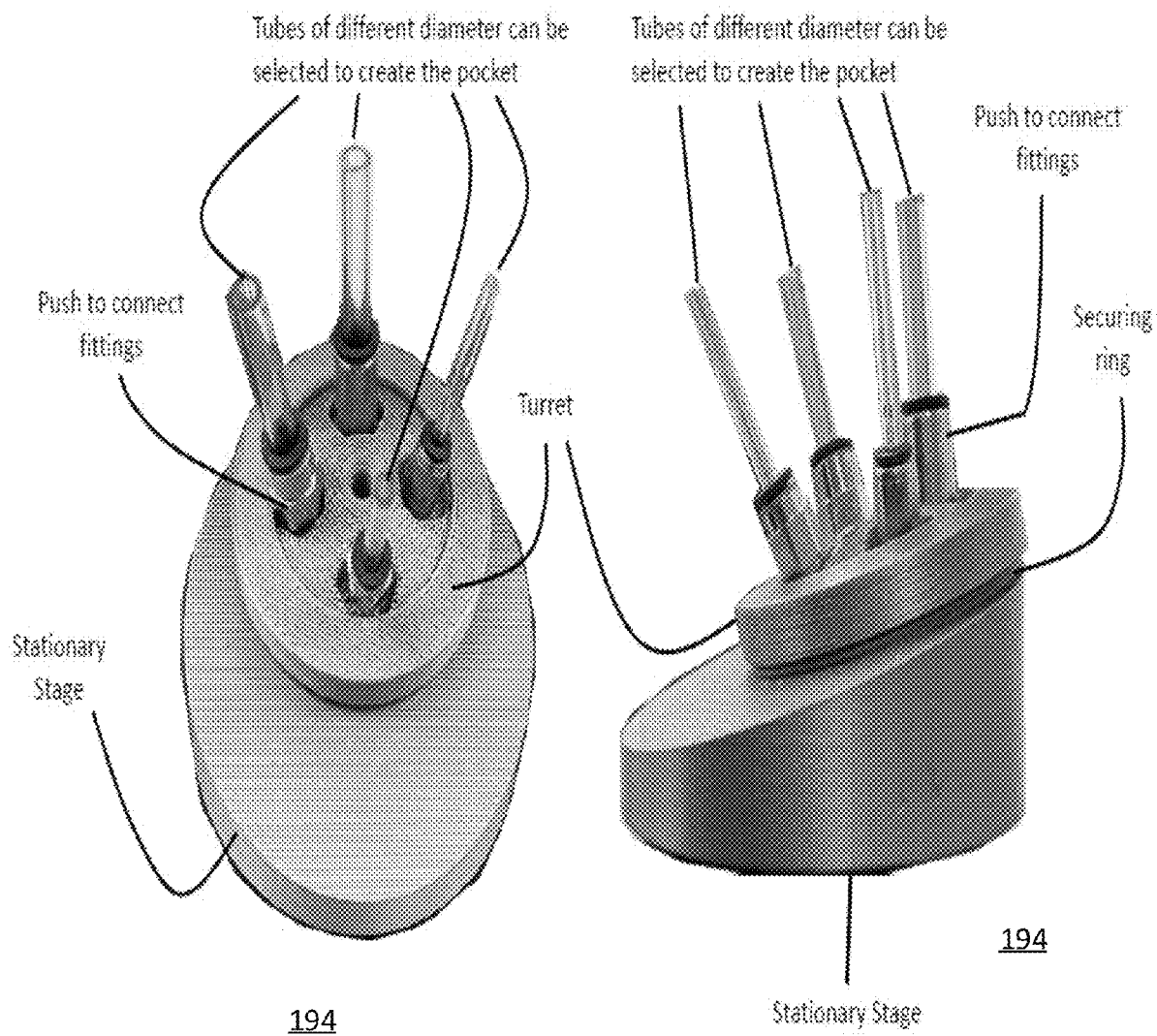
FIG. 19B is an overview of a vacuum tube selection manifold illustrated in FIG. 19A.

Next, FIG. 19B is an overview of a vacuum tube selection manifold 194 illustrated in FIG. 19A. In particular, the manifold 194 is used to select a particular vacuum tube among a plurality of vacuum tubes. Only the selected vacuum tube contacts the sMEA to create the pocket. As shown, the vacuum tubes can have different diameters for forming different sized 3D pockets, and can have different shapes (e.g. oval, rectangular, square, circular, triangular, star-shaped, etc.) for forming 3D pockets to have different shapes. In one embodiment, the plurality of vacuum tubes are single tubes, each with a diameter that can be changed depending on the desired pocket dimensions. Changing the selected vacuum tube involves stopping the vacuum suction for the first vacuum tube, followed by rotation of the manifold 194 to select the second vacuum tube so there will be single 3D pocket based on the diameter of the second vacuum tube. FIG. 19B illustrates the manifold 194 including a stationary stage, push to connecting fittings for the different tubes, and a turret that can be rotated with respect to the stationary stage to select different tubes with different diameters, for example. The securing ring can be rotated to secure the selected tube.

Figure 19C:
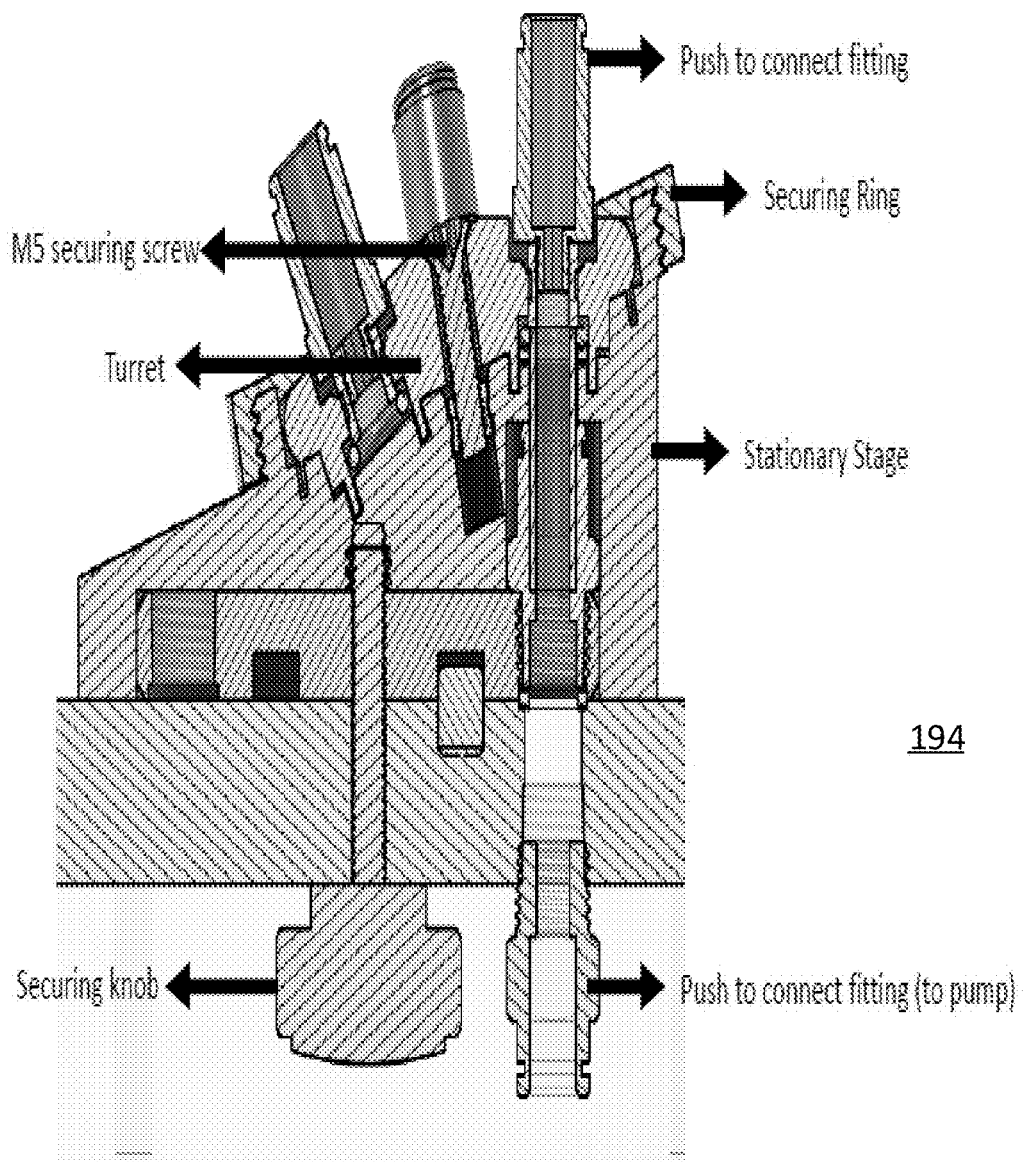
FIG. 19C is cross-sectional view of the vacuum tube selection manifold illustrated in FIG. 19B

FIG. 19C is cross-sectional overview of the vacuum tube selection manifold 194 illustrated in FIG. 19B. As shown, the manifold 194 includes a push to connect fitting used to push connect a corresponding vacuum tube, the securing ring, the stationary stage and the turret. FIG. 19C also illustrates an M5 securing screw and securing knob that can be used to secure the selected vacuum tube.

In another embodiment, each vacuum tube can be composed of two coaxial tubes with the outer diameter of the inner tube being smaller than the inner diameter of the outer tube. The vacuum suction can be maintained for both the first and second vacuum tubes thereby allowing to change the shape of the 3D pocket based on both the first and second diameters of the vacuum tubes. In this example, a 3D pocket can be formed having an upper 3D pocket based on the diameter of the first vacuum tube and a lower 3D pocket based on the diameter of the second vacuum tube. This second embodiment enables to form more complex shapes of the pocket.

Further, the suction force for the vacuum tube, and therefore the depth and shape of the pocket, can be varied with the vacuum regulator 198 in FIG. 19A. The regulator 198 can be a manual regulator (e.g., IRV20-LN11BG) or a digital regulator that consists of a controller (e.g., Arduino Uno Rev3) and a solenoid valve (e.g., EV-P-10-25A0-V). A lower the pressure in the vacuum tube means a larger suction force that is applied to the silicone membrane on the sMEA, and a larger suction force creates a deeper the pocket on the sMEA. For the embodiment with coaxial vacuum tubes, the suction force for each vacuum tube can be the same or different. For example, the suction force of the second vacuum tube can be greater than the suction force for the first vacuum tube. The change of vacuum suction can thus be used to change the shape of the 3D pocket in real time. If only using one vacuum tube, the suction force for that one vacuum tube can also be changed in real time to change the shape of the 3D pocket.

As shown in FIG. 18E, the vacuum tube selection manifold 194 includes a stationary stage, a turret, push-to-connect fittings, and tubes of different diameter. The stationary stage does not move. A push-to-connect fitting connects the vacuum from the vacuum pump via the regulator to the stationary stage. Only one of the vacuum tubes on the turret is connected to the vacuum from the vacuum pump at the stationary stage. The turret can rotate such that vacuum tubes of a different diameter or shape can be selected. The vacuum tubes are connected to the turret via push-to-connect fittings.

Figure 20:
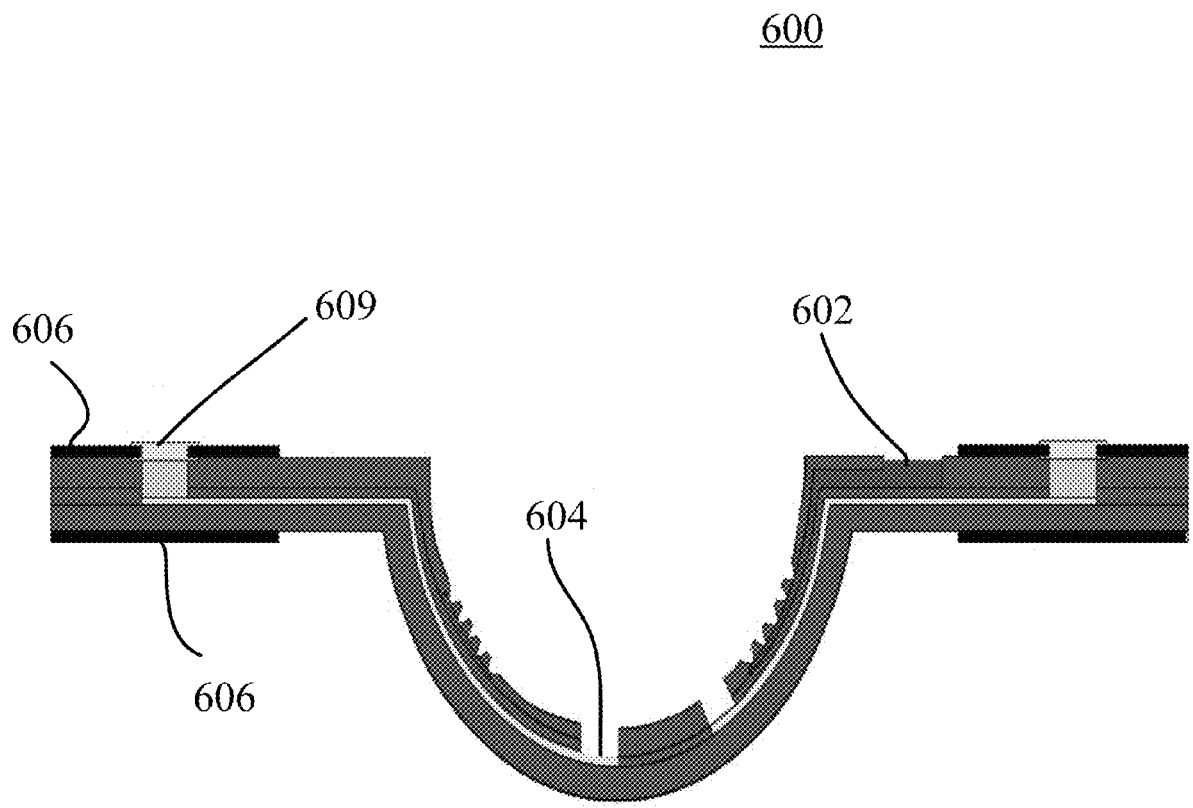
FIG. 20 is an overview of microfluidic channels included in an sMEA with a 3D pocket according to an embodiment of the present invention.

Next, FIG. 20 is an overview of microfluidic channels included in the permanent or the flexible pocket embodiments. The purpose of the microchannel is to perfuse the section of the organoid which rests close to the deepest location of the pocket with nutrients, oxygen, and drugs. This is to ensure that either all surfaces of the organoid receive the same amount of medium, or to produce controlled differences in nutrient/drug supplies. The channel is perfused via an inlet and an outlet as described above for the 2-chamber embodiment.

As shown in FIG. 20, microfluidic channels 602 in this embodiment are included in an sMEA 600 having a 3D pocket. As shown, the microfluidic channels 602 are arranged to the section of the organoid which rests close to the deepest location of the 3D pocket. Thus, these areas can be fed with nutrients, oxygen, and drugs to ensure either all surfaces of the organoid receive the same amount of medium, or to produce controlled differences in nutrient/drug supplies. FIG. 20 also illustrates microelectrodes 604, PCBs 606, contact pads 609, etc. similar to that shown in FIGS. 11 and 12. Thus, in this embodiment, the microfluidic channels 602 can be used in the sMEA 600 to feed organoids placed within the 3D pocket. As shown in FIG. 20, microfluidic channels 602 extends from an inlet port into a lower portion of the 3D pocket to diffuse the biochemical to the organoid placed in the 3D pocket. Further, the microfluidic channel is disposed closer to an innermost surface of the 3D pocket than the microelectrodes.

Further, a hardware-embedded or processor or computer can be programmed with the appropriate instructions for performing the functions described above. For example, a processor can be programmed to execute the functions of controlling the vacuum pump to provide the suction force to create the vacuum-formed 3D pocket lined with vacuum-stretched microelectrodes for electrically stimulating and recording signals from the organoid placed in the vacuum-formed 3D pocket, applying a voltage or a current to the microelectrodes to electrically stimulate the organoid in the vacuum-formed 3D pocket, recording electrical responses of the organoid placed in the vacuum-formed 3D pocket in response to the applied voltage or current to the microelectrodes, and controlling the camera to capture images of an organoid placed in the vacuum-formed 3D pocket. That is, the processor is a special purpose programmed processor to execute the instructions to perform the method of creating a vacuum-formed 3D pocket and analyzing image, electrical, stretchable, etc. characteristics of the organoid placed in the 3D pocket. The stretching of the organoid can be achieved by changing the shape of the 3D pocket using different suction forces or different sized vacuum tubes. For example, different processors can be used to control the equipment for forming the 3D pockets including for controlling the vacuum (the vacuum can be controlled manually as well), the electrophysiology module for recording and stimulating of the organoid and the camera/imaging module.

Figure 21:
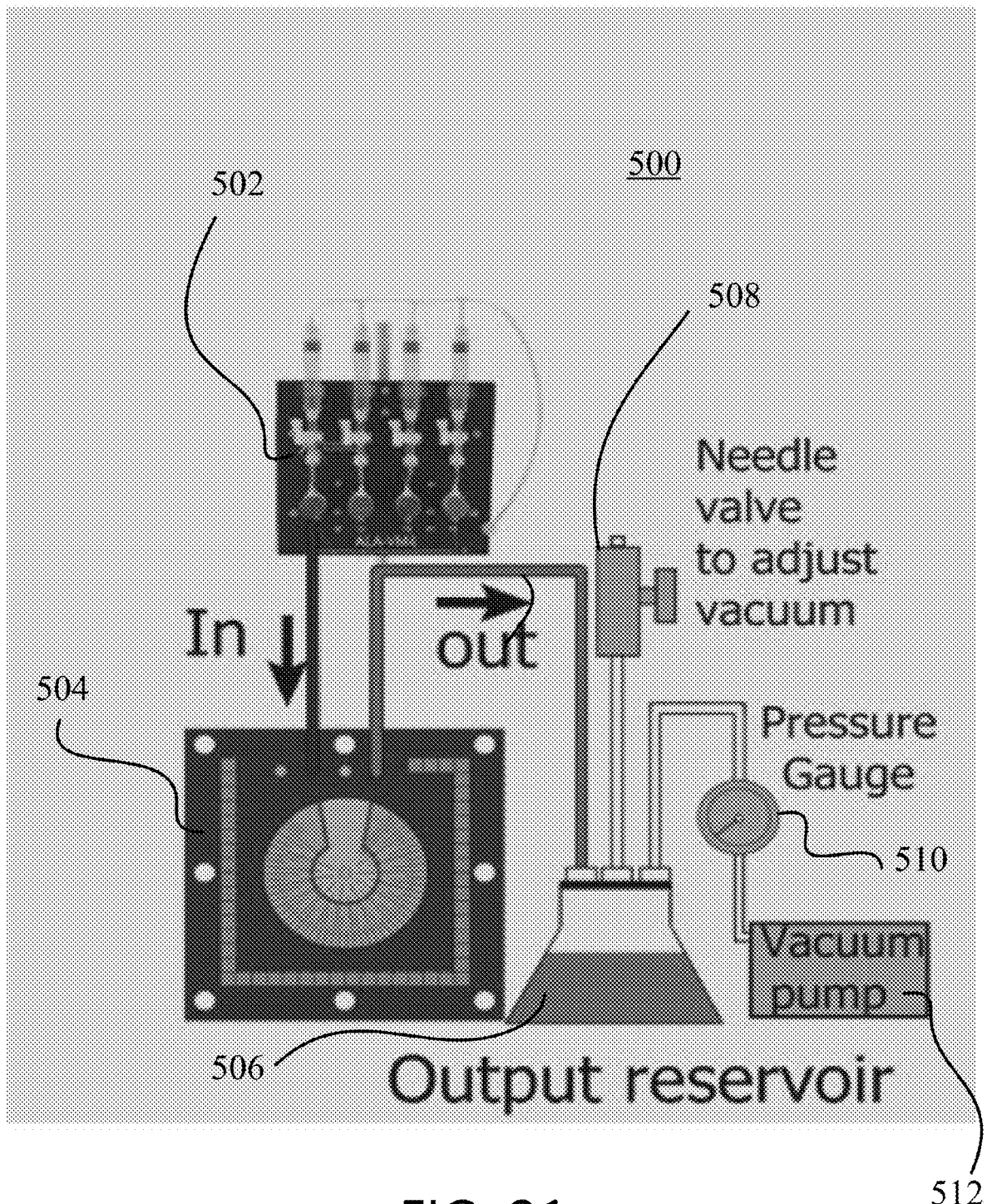
FIG. 21 is an overview of a perfusion module according to an embodiment of the present invention.

Next, FIG. 21 is an overview of a perfusion module according to an embodiment of the present invention. In particular, FIG. 21 illustrates a perfusion module 500 that can be integrated within the MEASSuRE. The perfusion module 500 includes a feeding bank 502 feeding fluids, medicine, nutrients, etc. though the microfluidic channels in the sMEA 504. The sMEA 504 in FIG. 21 is similar to the sMEA in FIGS. 11-14.

As shown, the perfusion module 500 further includes an output reservoir 506, a needle valve 508 to adjust the amount of vacuum pressure, a pressure gauge 510 for viewing and controlling the proper pressure, and a vacuum pump 512 responsible for providing the desired vacuum pressure. The perfusion module 500, which can be integrated into the MEASSuRE, is used to control the flow of nutrients, oxygen, and drugs to reproduce complex disease states in the human body. For example, the perfusion module 500 can be used to introduce, control, and provide a stable flow of medium/drugs (e.g., oxygen, nutrients, drugs, and other compounds) to the two chambers 141 and 143 through the microfluidic channel 145.

The medium is injected by controlled pressure or gravity into the microchannel of the sMEA 504, and after exiting the microchannel, the medium is collected in the output reservoir 506 for further analysis. In addition, the pressure can be adjusted and maintained via the needle valve 508. The feeding bank 502 illustrates four types of nutrients, etc. being fed to the microfluidic channels of the sMEA, but any number of feeding ports could be included.

In addition, the 3D sMEA allows for electrophysiology in 3D. This 3D type of research is particularly advantageous for the rapidly growing brain organoid market. With the 3D sMEA, the electrophysiological activity across the entire surface of physiologically intact brain organoids can be recorded by creating flexible pockets in the sMEAs using, for example, vacuum suction. Thus, it is possible to precisely control the composition of the medium entering the microfluidic channel 145. Further, the concentration of biomarkers and metabolic compounds can be determined by analyzing the composition of the medium exiting the microfluidic channel 145.

Therefore, the embodiments of the present invention advantageously improve the predictive value of pre-clinical drug screening to eliminate drug candidates earlier that would likely fail in a clinical trial, thus saving money, resources, and time that can be devoted to the most promising leads. A drug that delays the onset or slows down the progression of AD/ADRD would greatly improve the quality of life for patients and reduce the societal burden. The embodiments of the present invention provide an in vitro model platform that can be used for AD/ADRD drug screening and for mechanistic studies on TBI as a risk factor.

Various embodiments described herein may be implemented in a computer-readable medium using, for example, software, hardware, or some combination thereof. For a hardware implementation, the embodiments described herein may be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, micro-processors, other electronic units designed to perform the functions described herein, or a selective combination thereof. In some instances, such embodiments are implemented by the controller 180.

For a software implementation, the embodiments such as procedures and functions may be implemented together with separate software modules each of which performs at least one of functions and operations. The software codes can be implemented with a software application written in any suitable programming language. Also, the software codes may be stored in the memory 170 and executed by the controller 180. Thus, the components shown in FIG. 1 have sufficient structure to implement the appropriate algorithms for performing the described functions.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A soft and stretchable microelectrode array (sMEA) comprising:
a first circuit board having a first though hole;
a second circuit board having a second through hole;
a microelectrode array including a plurality of microelectrodes embedded in an elastomeric substrate, wherein the microelectrode array is disposed between the first and second printed circuit boards, and includes an exposed portion corresponding the first and second through holes;
a plurality of contact pads formed on a top or bottom surface of the first printed circuit board and electrically connected to the plurality of microelectrodes; and
a culture well mounted on the first printed circuit board and encompassing the first through hole,
wherein the exposed portion of the microelectrode array comprises a 3D pocket lined with stretchable microelectrodes for electrically stimulating and recording signals from an organoid placed in the 3D pocket, and
wherein the stretchable microelectrodes extend longitudinally from an upper portion of the 3D pocket to a lower portion of the 3D pocket and within the elastomeric substrate.

2. The sMEA of claim 1, further comprising:
a support member on a bottom surface of the 3D pocket for fixing a permanent shape of the 3D pocket.

3. The sMEA of claim 2, wherein the support member comprises a mold and cured glue.

4. The sMEA of claim 1, further comprising:
at least one microfluidic channel for diffusing a biochemical to the organoid placed in the 3D pocket.

5. The sMEA of claim 4, wherein the at least one microfluidic channel includes an inlet port disposed in the exposed portion of the microelectrode array at a position outside of the 3D pocket, and
wherein the at least one microfluidic channel extends from the inlet port into a lower portion of the 3D pocket to diffuse the biochemical to the organoid placed in the 3D pocket.

6. The sMEA of claim 4, wherein the at least one microfluidic channel is disposed closer to an innermost surface of the 3D pocket than the plurality of microelectrodes.

7. The sMEA of claim 4, wherein the plurality of microelectrodes extend past the at least one microfluidic channel towards a bottom central portion of the 3D pocket.

8. The sMEA of claim 1, wherein the exposed portion of the microelectrode array comprises a central area including the 3D pocket and a peripheral area surrounding the central area, and
wherein the plurality of microelectrodes disposed within the 3D pocket are stretched more than the microelectrodes disposed in the peripheral area of the microelectrode array.

9. The sMEA of claim 1, wherein the 3D pocket comprises a vacuumed-formed 3D pocket.

10. A soft and stretchable microelectrode array (sMEA) comprising:
a first circuit board having a first though hole;
a second circuit board having a second through hole;
a microelectrode array including a plurality of microelectrodes embedded in an elastomeric substrate, wherein the microelectrode array is disposed between the first and second printed circuit boards, and includes an exposed portion corresponding the first and second through holes;
a plurality of contact pads formed on a top or bottom surface of the first printed circuit board and electrically connected to the plurality of microelectrodes;
a central chamber formed in an interior central portion of the elastomeric substrate and configured to receive a first 3D matrix; and
a peripheral chamber formed in an interior peripheral portion of the elastomeric substrate and encompassing a partial portion of the central chamber and configured to receive a second 3D matrix.

11. The sMEA of claim 10, further comprising:
a central chamber port configured to introduce the first 3D matrix into the central chamber;
a peripheral chamber port configured to introduce the second 3D matrix into the peripheral chamber; and
at least one microfluidic channel disposed between the central chamber and the peripheral chamber and including an inlet port for diffusing a biochemical into the central chamber and the peripheral chamber.

12. The sMEA of claim 10, wherein the biochemical includes at least one of a nutrient, a biomarker, oxygen, a drug, or a pharmacologically active compound.

13. The sMEA of claim 11, wherein the central chamber and the peripheral chamber comprise ring-shaped internal passageways within the elastomeric substrate.

14. The sMEA of claim 13, further comprising:
first and second trapezoidal posts disposed between the central chamber and the peripheral chamber.

15. The sMEA of claim 14, wherein the first trapezoidal posts are spaced a predetermined distance apart from each other, the second trapezoidal posts are spaced a predetermined distance apart from each other, and the first and second trapezoidal posts are spaced a predetermined distance apart from each other to form the at least one microfluidic channel between the first and second trapezoidal posts.

16. The sMEA of claim 10, wherein the plurality of contact pads are formed on an upper or lower layer of the first circuit board and are connected to the plurality of microelectrodes via trenches formed through the elastomeric substrate.

17. A micro electrode array stimulating and recording equipment, comprising:
 a camera configured to capture images;
 an interface board mounted with a soft and stretchable microelectrode array (sMEA) including a first circuit board having a first though hole; a second circuit board having a second through hole; a microelectrode array including a plurality of microelectrodes embedded in an elastomeric substrate, wherein the microelectrode array is disposed between the first and second printed circuit boards, and includes an exposed portion corresponding the first and second through holes; a plurality of contact pads formed on a top surface of the first printed circuit board and electrically connected to the plurality of microelectrodes, and a culture well mounted on the first printed circuit board and encompassing the first through hole;
 a vacuum tube disposed below the microelectrode array;
 a vacuum pump connected to the vacuum tube and configured to provide a vacuum suction force to create a vacuum-formed 3D pocket lined with vacuum-stretched microelectrodes for electrically stimulating and recording signals from an organoid placed in the vacuum-formed 3D pocket; and
 a processor configured to:
 apply a voltage or a current to the plurality of microelectrodes to electrically stimulate the organoid in the vacuum-formed 3D pocket,
 record electrical responses of the organoid placed in the vacuum-formed 3D pocket in response to the applied voltage or current to the plurality of microelectrodes, and
 control the camera to capture images of the organoid placed in the vacuum-formed 3D pocket.

18. The micro electrode array stimulating and recording equipment of claim 17, further comprising:
 a manifold configured to select the vacuum tube among a plurality of vacuum tubes having different diameters,
 wherein the processor is further configured to control the vacuum pump to provide a predetermined vacuum force to create a predetermined depth of the 3D pocket.

19. The micro electrode array stimulating and recording equipment of claim 17, further comprising:
 an auxiliary vacuum tube having a smaller diameter than a diameter of the vacuum tube and configured to be disposed within the vacuum tube to create another vacuum-formed 3D pocket with the auxiliary tube having the smaller diameter.

20. The micro electrode array stimulating and recording equipment of claim 19, wherein the processor is further configured to:
 control a suction force of the vacuum tube to be a first value, and
 control a suction force of the auxiliary vacuum tube to be a second value equal or different than the first value.

* * * * *